(12) United States Patent
Mitsuzuka et al.

(10) Patent No.: US 10,529,800 B2
(45) Date of Patent: Jan. 7, 2020

(54) SEMICONDUCTOR DEVICE

(71) Applicant: FUJI ELECTRIC CO., LTD., Kanagawa (JP)

(72) Inventors: Kaname Mitsuzuka, Matsumoto (JP); Yuichi Onozawa, Matsumoto (JP); Takahiro Tamura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 59 days.

(21) Appl. No.: 15/897,162

(22) Filed: Feb. 15, 2018

(65) Prior Publication Data

US 2018/0233554 A1 Aug. 16, 2018

(30) Foreign Application Priority Data

Feb. 16, 2017 (JP) .................................. 2017-026875
Dec. 15, 2017 (JP) .................................. 2017-240871

(51) Int. Cl.
| | | |
|---|---|---|
| H01L 29/06 | (2006.01) | |
| H01L 29/10 | (2006.01) | |
| H01L 27/06 | (2006.01) | |
| H01L 29/739 | (2006.01) | |

(52) U.S. Cl.
CPC ...... *H01L 29/0638* (2013.01); *H01L 27/0635* (2013.01); *H01L 29/0619* (2013.01); *H01L 29/0696* (2013.01); *H01L 29/1095* (2013.01); *H01L 29/7397* (2013.01)

(58) Field of Classification Search
None
See application file for complete search history.

(56) References Cited

U.S. PATENT DOCUMENTS

| | | | | |
|---|---|---|---|---|
| 5,859,446 A | * | 1/1999 | Nagasu | ................. H01L 29/417 257/104 |
| 9,825,163 B2 | * | 11/2017 | Tamaki | ............... H01L 29/7811 |
| 10,056,501 B2 | * | 8/2018 | Kakefu | ................. H01L 29/861 |
| 2010/0019342 A1 | | 1/2010 | Kawano et al. | |
| 2014/0281240 A1 | | 9/2014 | Willhalm | |

(Continued)

FOREIGN PATENT DOCUMENTS

| | | |
|---|---|---|
| JP | 2013-179342 A | 9/2013 |
| JP | 2015-177142 A | 10/2015 |

(Continued)

*Primary Examiner* — Steven B Gauthier

(57) ABSTRACT

A semiconductor device is provided, including: a semiconductor substrate having an active area and an edge termination region; an upper electrode; an insulating film provided between the semiconductor substrate and the upper electrode and having a contact hole; a first conductivity-type drift region; a second conductivity-type base region; a second conductivity-type well region; and a second conductivity-type extension region formed extending in a direction toward the well region from the base region and separated from the upper electrode by the insulating film, wherein a sum of a first distance from an end portion of the contact hole closer to the well region to an end portion of the extension region closer to the well region and a second distance from the end portion of the extension region closer to the well region to the well region is smaller than a thickness of the semiconductor substrate in the active area.

10 Claims, 17 Drawing Sheets

(56) References Cited

U.S. PATENT DOCUMENTS

2014/0327072 A1* 11/2014 Nishii ................. H01L 29/0615
257/330
2015/0364613 A1* 12/2015 Onozawa ............ H01L 29/7395
257/481
2019/0035884 A1* 1/2019 Bauer ..................... H01L 29/36

FOREIGN PATENT DOCUMENTS

JP         2016-129041 A     7/2016
WO    WO 2016/114138    *   7/2016  ........... H01L 29/861

* cited by examiner

SEMICONDUCTOR DEVICE

The contents of the following Japanese patent applications are incorporated herein by reference:
NO. 2017-026875 filed on Feb. 16, 2017, and
NO. 2017-240871 filed on Dec. 15, 2017

BACKGROUND

1. Technical Field

The present invention relates to a semiconductor device.

2. Related Art

For semiconductor devices such as a diode of FWD (Free Wheeling Diode) connected in parallel with a power device such as an insulated gate bipolar transistor (IGBT), a structure is conventionally known in which a p-type region is extended to the outside of a contact portion for an anode electrode on the upper surface of the semiconductor substrate (see Patent Document 1, for example).

Patent Document 1: Japanese Patent Application Publication No. 2013-179342

Semiconductor devices preferably have a high reverse recovery withstand capability.

SUMMARY

An aspect of the present invention provides a semiconductor device including a semiconductor substrate having formed therein an active area in which main current flows and an edge termination region to relax electric field. The semiconductor device may include an upper electrode provided above the semiconductor substrate. The semiconductor device may include an insulating film which is provided between the semiconductor substrate and the upper electrode, and has formed therein a contact hole. The semiconductor device may include a first conductivity-type drift region formed inside the semiconductor substrate. The semiconductor device may include a second conductivity-type base region which is formed on an upper-surface side of the semiconductor substrate in the active area, and is connected to the upper electrode through the contact hole. The semiconductor device may include a second conductivity-type well region which is formed on an upper-surface side of the semiconductor substrate in the edge termination region, and is separated from the upper electrode. The semiconductor device may include a second conductivity-type extension region which is formed extending in a direction toward the well region from the base region on an upper-surface side of the semiconductor substrate, and is separated from the upper electrode by the insulating film. In a plane parallel to the upper surface of the semiconductor substrate, a sum of a first distance from an end portion of the contact hole closer to the well region to an end portion of the extension region closer to the well region and a second distance from the end portion of the extension region closer to the well region to the well region may be smaller than a thickness of the semiconductor substrate in the active area.

The sum of the first distance and the second distance may be greater than 50 µm. The sum of the first distance and the second distance may be smaller than 100 µm.

A doping concentration $N_A$ of the extension region may satisfy the following formula:

$$0.1 < \frac{N_A}{\left(\frac{J_{rate} \times 30}{q \cdot v_{sat\_P}}\right)} < 10$$

wherein Jrate is a rated current density (A/cm²), q is an elementary charge (C), and $v_{sat\_P}$ is a saturation velocity of holes (cm/sec). A doping concentration of the extension region may be $5.0 \times 10^{16}$/cm³ or more and $3.0 \times 10^{17}$/cm³ or less.

A depth of the extension region may be same as a depth of the well region. A doping concentration of the extension region may be same as a doping concentration of the well region.

The semiconductor device may include a first conductivity-type cathode region which is provided between the drift region and a lower surface of the semiconductor substrate inside the semiconductor substrate, and has a higher doping concentration than the drift region. An end portion of the cathode region closer to the edge termination region may be arranged closer to the active area than the well region. The end portion of the cathode region closer to the edge termination region may be arranged closer to the active area than the end portion of the extension region closer to the well region. The end portion of the cathode region closer to the edge termination region may be arranged closer to the active area than the end portion of the contact hole closer to the well region. At a corner portion of the semiconductor substrate, a radius of curvature of an end portion of the contact hole in top view may be greater than a radius of curvature of an end portion of the extension region in top view.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In this specification, one side in a direction parallel to the depth direction of a semiconductor substrate is referred to as an "upper" side, and the other side is referred to as a "lower" side. One of two principal surfaces of a substrate, a layer or some other member is referred to as an upper surface, and the other surface is referred to as a lower surface. The "upper" and "lower" directions are not limited to the gravitational direction or directions when the semiconductor device is implemented. In this specification, technical matters may be described using orthogonal coordinate axes of X-axis, Y-axis and Z-axis. In this specification, the X-Y plane is defined as a plane parallel to the upper surface of a semiconductor substrate, and Z-axis is defined to be along a depth direction perpendicular to the upper surface of the semiconductor substrate.

An example where a first conductivity type is n-type and a second conductivity type is p-type is shown in each example embodiment, but the first conductivity type may be p-type and the second conductivity type may be n-type. In this case, the conductivity types of a substrate, a layer, a region and the like in each example embodiment will each be oppositely polarized.

Figure 1:
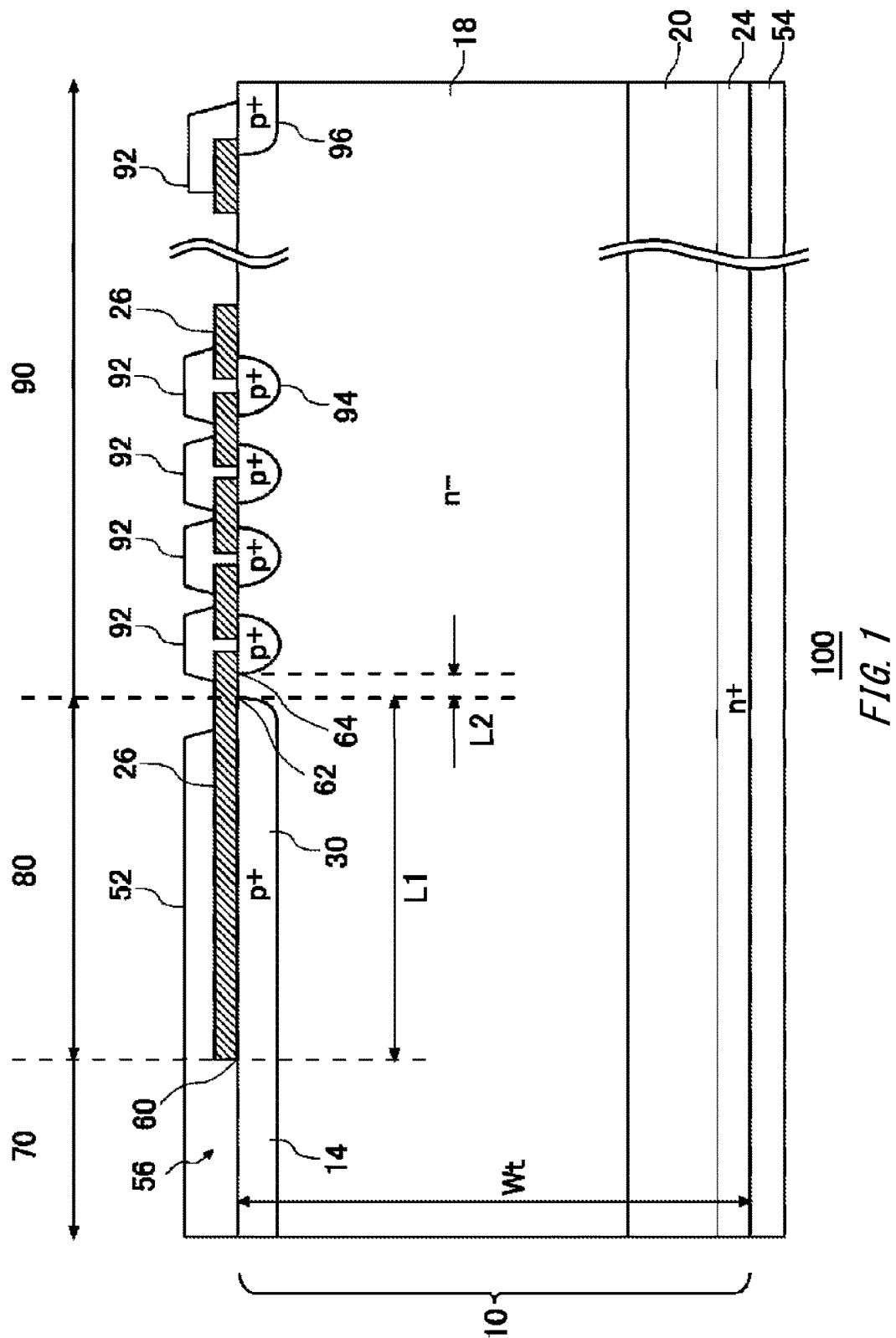
FIG. 1 is a cross-sectional view showing an example of a semiconductor device 100 according to an embodiment of the present invention.

FIG. 1 is a cross-sectional view showing an example of a semiconductor device 100 according to an embodiment of the present invention. FIG. 1 shows a cross section taken in a direction perpendicular to the upper surface of a semiconductor substrate 10 in which the semiconductor device 100 is formed.

The semiconductor device 100 includes a semiconductor substrate 10. The semiconductor substrate 10 is a substrate formed of a semiconductor material such as silicon, silicon carbide and gallium nitride. At least part of the semiconductor substrate 10 may be formed by bulk wafer or epitaxial growth or the like. The semiconductor substrate 10 includes an (n−)-type drift region 18.

In the semiconductor substrate 10, an (n+)-type cathode region 24 having a higher doping concentration than the drift region 18 is formed between the drift region 18 and the lower surface of the semiconductor substrate 10. The cathode region 24 is exposed on the lower surface of the semiconductor substrate 10. The cathode region 24 may be formed over the entire lower surface of the semiconductor substrate 10, or may be formed in a partial region thereof.

An (n+)-type buffer region 20 having a higher doping concentration than the drift region 18 may be formed between the drift region 18 and the cathode region 24. The buffer region 20 may function as a field stop region to prevent a depletion layer, spreading from the base region 14, from reaching the same depth as the cathode region 24. The base region 14 functions as an anode region of a diode.

An upper electrode 52 is formed above the upper surface of the semiconductor substrate 10. The upper electrode 52 functions as an anode electrode. A lower electrode 54 is formed on the lower surface of the semiconductor substrate 10. The lower electrode 54 functions as a cathode electrode. The upper electrode 52 and the lower electrode 54 are formed of one or more metal materials such as aluminum, copper and tungsten. In this specification, from among the principal surfaces of the semiconductor substrate 10, a surface on which the upper electrode 52 is formed is referred to as an upper surface, and a surface on which the lower electrode 54 is formed is referred to as a lower surface.

An insulating film 26 is formed between the upper surface of the semiconductor substrate 10 and the upper electrode 52. The insulating film 26 may include one or more of an oxide film, a nitride film and silicate glass. A contact hole 56 penetrating the insulating film 26 is formed in the insulating film 26. The upper electrode 52 is also formed inside the contact hole 56. The upper electrode 52 is connected to the upper surface of the semiconductor substrate 10 through the contact hole 56.

An active area 70, an extension section 80 and an edge termination region 90 are formed in the semiconductor substrate 10. The active area 70 is a region in which main current of the semiconductor device 100 flows. The main current refers to current which flows between the upper electrode 52 and the lower electrode 54, for example. At least a partial region of the active area 70 operates as a diode such as an FWD. A transistor such as an IGBT may further be formed in the active area 70.

A (p+)-type base region 14 is formed in the upper surface of the semiconductor substrate 10 in the active area 70. The base region 14 is exposed on the upper surface of the semiconductor substrate 10. The base region 14 is electrically connected to the upper electrode 52 through the contact hole 56.

The edge termination region 90 is formed closer to the edge of the semiconductor substrate 10 than the active area 70. The edge termination region 90 relaxes electric field concentration at the end portion of the active area 70. On the upper surface of the semiconductor substrate 10, the edge termination region 90 is formed to surround the active area 70. The edge termination region 90 includes one or more (p+)-type well regions 94 inside the semiconductor substrate 10. Each well region 94 may be exposed on the upper surface of the semiconductor substrate 10.

Each well region 94 may be provided to surround the active area 70 in a plane parallel to the upper surface of the semiconductor substrate 10. The well region 94 may function as a guard ring to extend the depletion layer, extending from the active area 70, to the vicinity of the edge of the semiconductor substrate 10 in a direction parallel to the upper surface of the semiconductor substrate 10.

The well region 94 is separated from the upper electrode 52. The well region 94 of the present example is not electrically connected to the upper electrode 52. The upper surface of the well region 94 of the present example is covered by the insulating film 26.

The edge termination region 90 may further include one or more metal films 92 formed above the semiconductor substrate 10. The metal film 92 may be formed of the same material as the upper electrode 52. The metal film 92 may be provided for each well region 94. The metal film 92 is provided to cover the well region 94. The metal film 92 may function as a field plate. The metal film 92 may be connected to the well region 94 through a contact hole formed in the insulating film 26. The metal film 92 is provided being separated from the upper electrode 52.

The edge termination region 90 may further include a (p+)-type or (n+)-type channel stopper 96 at the end portion of the semiconductor substrate 10. The insulating film 26 may be provided on the upper surface of the channel stopper 96. The channel stopper 96 may be connected to the metal film 92.

The extension section 80 is provided between the active area 70 and the edge termination region 90. The extension section 80 may be provided between an end portion 60 of the contact hole 56 closer to the well region 94 in the active area 70 and the edge termination region 90. In an example, on the upper surface of the semiconductor substrate 10, the extension section 80 may be provided to surround the active area 70. In FIG. 1, an end portion of the active area 70 at which a diode is formed, the extension section 80 and the edge termination region 90 are shown.

In this specification, the end portion 60 of the contact hole 56 closer to the edge termination region 90 (an outermost perimeter end of the surface at which the upper electrode 52 and the surface layer of the front surface of the semiconductor substrate 10 are in contact) is regarded as the boundary between the active area 70 and the extension section 80. The extension section 80 includes a (p+)-type extension region 30 formed extending from the base region 14 in a direction toward the well region 94 inside the semiconductor substrate 10. The extension region 30 is separated from the upper electrode 52 by the insulating film 26. The extension region 30 of the present example is exposed on the upper surface of the semiconductor substrate 10. The upper surface of the extension region 30 is covered by the insulating film 26. The upper electrode 52 may be provided above the extension region 30 with intervention of the insulating film 26.

The extension region 30 functions as a high-resistance region during operation of the semiconductor device 100. By providing the extension region 30, implantation of holes from the upper electrode 52 into the edge termination region 90 during operation of the semiconductor device 100 can be suppressed. The concentration of excessive amounts of holes and electrons to be stored in the edge termination region 90 is reduced, and therefore current which flows from the edge termination region 90 toward the active area 70 during reverse recovery operation of the semiconductor device 100 can be reduced. Thus, current crowding during reverse recovery operation can be mitigated.

When a large hole current flows in the extension region 30 during reverse recovery operation of the semiconductor device 100, the hole concentration p is increased, and thereby the electric charge of acceptors ($-N_A$, where $N_A$ is the acceptor concentration) in the extension region 30 and the electric charge of holes (+p) are cancelled. As a result, the absolute value of the space charge density ($|p-N_A|$) in the extension region 30 is decreased, so that the space charge becomes near neutral. Thus, the extension region 30 may become unable to function as a (p+)-type region. In this case, the depletion layer is terminated at the upper surface of the extension section 80 during reverse recovery of the semiconductor device 100, so that electric fields may concentrate at the vicinity of the extension section 80.

In the present example, the distance from the end portion 60 of the contact hole 56 closer to the well region 94 to an end portion 62 of the extension region 30 closer to the well region 94 in a plane parallel to the upper surface of the semiconductor substrate 10 is referred to as a first distance L1. The first distance L1 corresponds to the length of the extension region 30. Also, the distance from the end portion 62 of the extension region 30 closer to the well region 94 to an end portion 64 of the well region 94 closer to the extension region 30 in a plane parallel to the upper surface of the semiconductor substrate 10 is referred to as a second distance L2. The distance L1 and the distance L2 refer to the respective shortest distances. The distance L1 and the distance L2 may be distances on the same straight line. If a plurality of well regions 94 are provided, one of the well regions 94 that is closest to the extension region 30 is associated with the second distance L2.

In the semiconductor device 100, the sum of the first distance L1 and the second distance L2 is smaller than a thickness Wt of the semiconductor substrate 10. In this manner, even if acceptors in the extension region 30 and holes are cancelled during reverse recovery operation, the depletion layer can be extended from the active area 70 to the edge termination region 90. Accordingly, the reverse recovery withstand capability can be improved. The thickness Wt of the semiconductor substrate 10 may adopt the average thickness of the edge termination region 90. The position of the end portion 62 of the extension region 30 may be regarded as the boundary position between the extension section 80 and the edge termination region 90.

Figure 2:
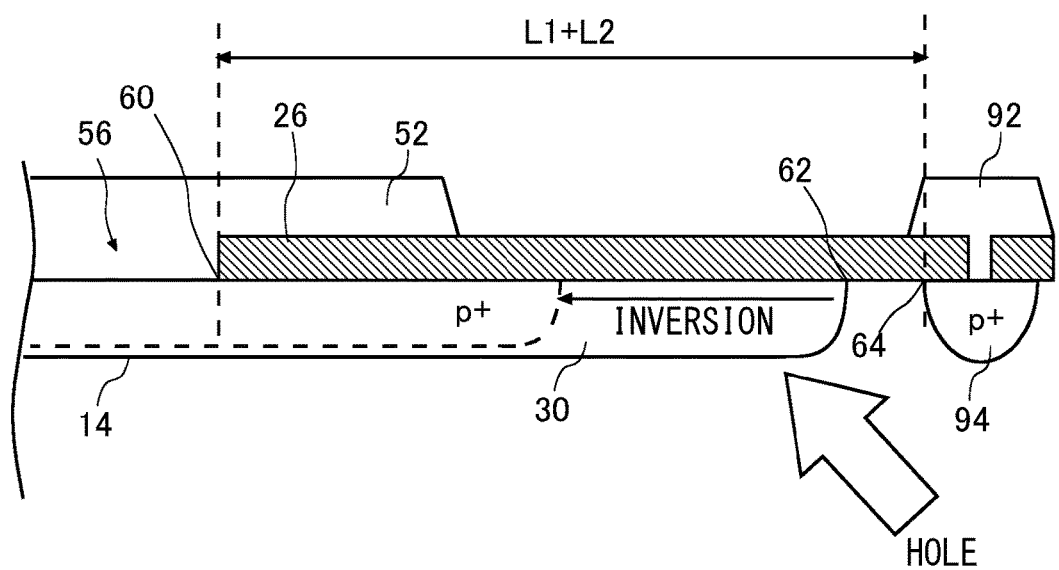
FIG. 2 illustrates reverse recovery operation of the semiconductor device in the case where the sum of a first distance L1 and a second distance L2, L1+L2, is sufficiently greater than a thickness Wt of a semiconductor substrate 10.

FIG. 2 illustrates reverse recovery operation of the semiconductor device in the case where the sum of the first distance L1 and the second distance L2, L1+L2, is sufficiently greater than the thickness Wt of the semiconductor substrate 10. During reverse recovery of the semiconductor device, a large amount of holes are implanted from the edge termination region 90 to the end portion of the extension region 30. As a result, acceptors at the end portion of the extension region 30 are cancelled by holes, so that the absolute value of the space charge density is decreased and the substantial function of acceptors is depressed. If the concentration of implanted holes is increased, the end portion of the extension region 30 becomes unable to function as a (p+)-type region. For example, if the concentration of holes implanted into the extension region 30 is large, a partial region of the extension region 30 may function as being inverted into an n-type region or a neutral region.

In particular, at the end portion 62 of the extension region 30 distanced from the end portion 60 of the contact hole 56, holes are concentratedly implanted from the edge termination region 90, and it takes time to extract the implanted holes. Thus, as indicated by dotted line in FIG. 2, the extension region 30 that can function as a (p+)-type region is temporarily shortened.

Figure 3:
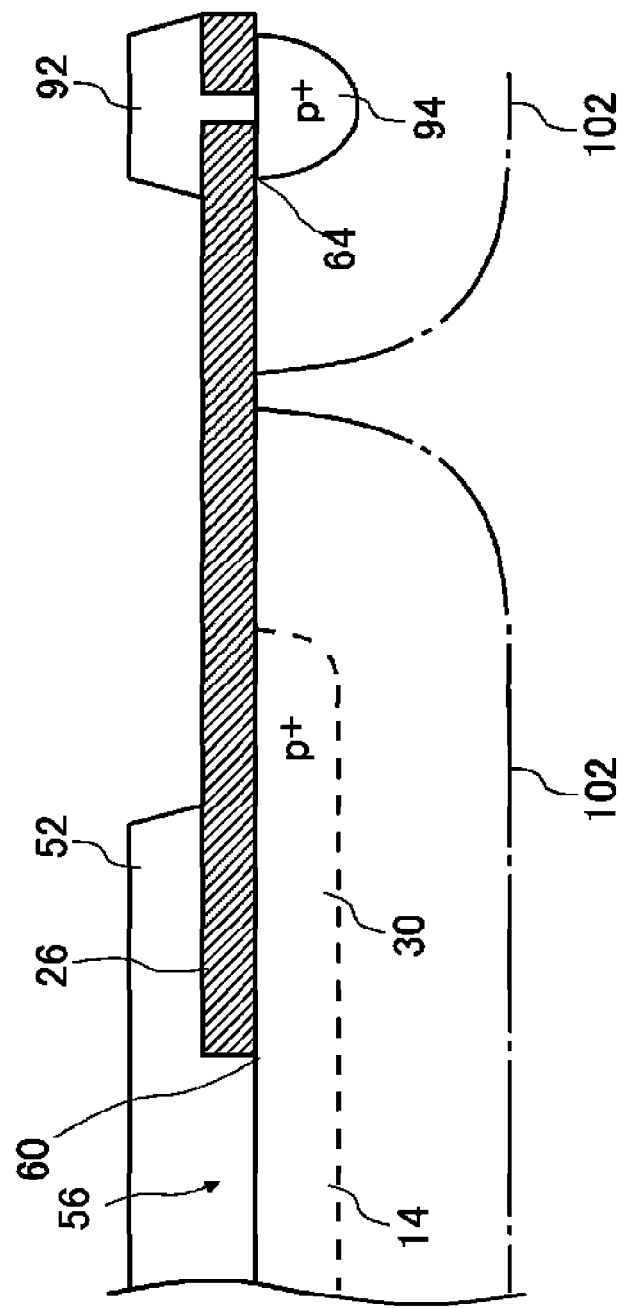
FIG. 3 shows an example of spread of a depletion layer in the example of FIG. 2.

FIG. 3 shows an example of spread of the depletion layer in the example of FIG. 2. When the extension region 30 that can function as a (p+)-type region is shortened as shown in FIG. 2, the distance between the extension region 30 and the adjacent well region 94 increases. Thus, the depletion layer 102 may be contracted toward the active area 70 or terminated at the upper surface of the semiconductor substrate 10 between the extension region 30 and the well region 94. In this case, electric fields concentrate between the extension region 30 and the well region 94, and the withstand capability of the semiconductor device is lowered.

Figure 4:
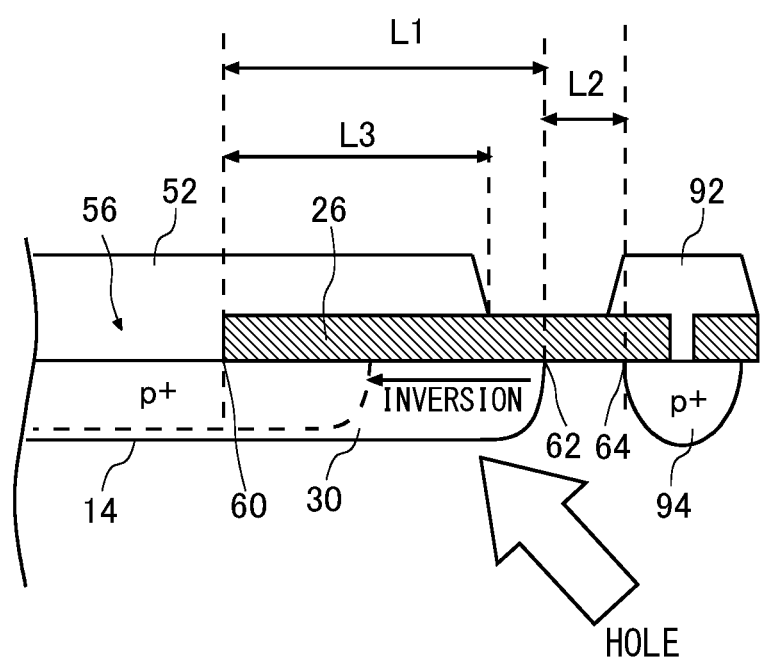
FIG. 4 illustrates reverse recovery operation of the semiconductor device 100 in the case where the sum of the first distance L1 and the second distance L2, L1+L2, is smaller than the thickness Wt of the semiconductor substrate 10.

FIG. 4 illustrates reverse recovery operation of the semiconductor device 100 in the case where the sum of the first distance L1 and the second distance L2, L1+L2, is smaller than the thickness Wt of the semiconductor substrate 10. In a manner similar to the example of FIG. 2, holes are implanted from the edge termination region 90 into the extension region 30 during reverse recovery of the semiconductor device 100. As a result, the substantial length of the extension region 30 is temporarily shortened.

Figure 5:
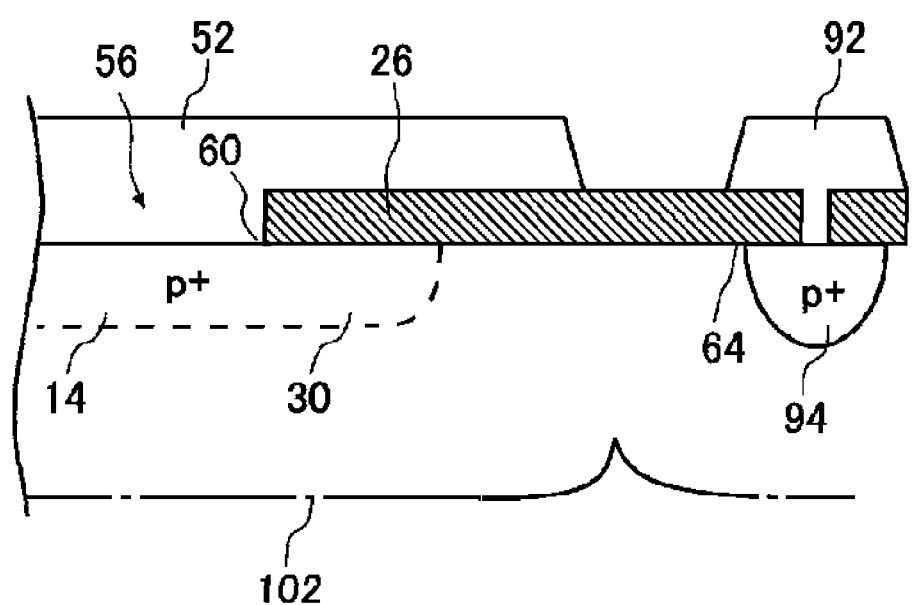
FIG. 5 shows an example of spread of the depletion layer in the example of FIG. 4.

FIG. 5 shows an example of spread of the depletion layer in the example of FIG. 4. In the present example, the sum of the first distance L1 and the second distance L2, L1+L2, is sufficiently small. By making L1+L2 small, a depletion layer 102 spreading from the base region 14 and a depletion layer 102 formed around the well region 94 adjacent to the base region 14 can be closely connected to each other even if the substantial length of the extension region 30 is decreased. In this manner, termination of the depletion layer 102 between the extension region 30 and the well region 94 can be suppressed.

For example, in the vicinity of the upper electrode 52, holes implanted into the extension region 30 can be extracted relatively quickly. Thus, the extension region 30 can function as a (p+)-type region at least in the vicinity of the upper electrode 52. Accordingly, by making the distance L1+L2 from the end portion 60 of the contact hole 56 to the well region 94 sufficiently small, exposure of the depletion layer 102 on the upper surface of the substrate can be suppressed so as to suppress lowering of the withstand capability of the semiconductor device 100 even if part of the extension region 30 temporarily becomes unable to function as a (p+)-type region.

Specifically, lowering of the withstand capability of the semiconductor device 100 can be suppressed by making the distance L1+L2 smaller than the thickness Wt of the semiconductor substrate 10. The distance L1+L2 may be 90% or less, or 80% or less of the thickness Wt of the semiconductor substrate 10. The distance L2 may be 5 μm or less. Also, the distance L2 may be 80% or more and 120% or less of the average interval between well regions 94.

The thickness Wt of the semiconductor substrate 10 varies with the rated voltage of the semiconductor device 100. In an example, for the semiconductor device 100 with a rated voltage of 600 V, the thickness Wt of the semiconductor substrate 10 is approximately 60 μm. The thickness of the semiconductor substrate 10 increases as the rated voltage increases. The distance L1+L2 may be smaller than 100 μm, may be smaller than 90 μm, or may be smaller than 80 μm.

Note that, if the distance L1+L2 is excessively short, the length of the extension region 30 is restricted, and therefore the effect of suppressing implantation of holes into the edge termination region 90 may be decreased. The distance L1+L2 may be 50% or more, or 70% or more of the thickness Wt of the semiconductor substrate 10. Also, the distance L1+L2 may be greater than 50 μm, may be greater than 60 μm, or may be greater than 70 μm.

Also, the distance L1 is preferably greater than the distance L2. For example, the distance L1 may be 5 times or more, ten times or more, or twenty times or more the distance L2. In this manner, the extension region 30 can be formed to have a sufficient length, so as to improve the effect of suppressing hole implantation into the edge termination region 90.

Also, a length L3 by which the upper electrode 52 extends from the end portion 60 of the contact hole 56 in a direction toward the well region 94 on the insulating film 26 may be 50% or more, or 70% or more of the length L1 of the extension region 30. By extending the upper electrode 52 toward the well region 94, termination of the depletion layer 102 between the extension region 30 and the well region 94 can be suppressed even if the extension region 30 is substantially shortened. The length L3 may be smaller than the value obtained by subtracting L3 from L1+L2.

Also, the doping concentration (acceptor concentration $N_A$ in the present example) of the extension region 30 may be in a range of the following formula. The acceptor concentration $N_A$ of the extension region 30 may be a peak value in the extension region 30. Note that Jrate is the rated current density (A/cm²), q is the elementary charge (=1.6e$^{-19}$ (C)), and $v_{sat\_P}$ is the saturation velocity of holes (approximately 7×10⁶ to 1×10⁷ (cm/sec) in the case of silicon for example, and in an example, 7×10⁶ (cm/sec)). In an example, a semiconductor device with a rated voltage of 600 V has a rated current density of approximately 500 A/cm², and the rated current density decreases as the rated voltage increases. The value of Jrate×30/q·$v_{sat\_P}$ in the following formula is a concentration index of the acceptor concentration of the extension region 30. As the density of holes that flow from the edge termination region 90 toward the extension section 80 is approximately ten times the rated current density, the concentration index is the value obtained by multiplying its approximate calculation, Jrate×10/q·$V_{sat\_P}$, by three as a withstand capability margin. Thus, the acceptor concentration $N_A$ of the extension region 30 may be in a range of the following formula with respect to the concentration index:

$$0.1 < \frac{N_A}{\left(\frac{J_{rate} \times 30}{q \cdot v_{xat\_P}}\right)} < 10$$

If the doping concentration of the extension region 30 is excessively low, the resistance value of the extension region 30 is increased. In this case, during reverse recovery operation of the semiconductor device 100, holes from the edge termination region 90 concentrate at the end portion 60 of the contact hole 56 without passing through the extension region 30. Thus, the withstand capability of the semiconductor device 100 is lowered.

If the doping concentration of the extension region 30 is excessively high, the resistance value of the extension region 30 is lowered. In this case, implantation of carriers into the edge termination region 90 during operation of the semiconductor device 100 can not be suppressed. Thus, a large amount of holes flow from the edge termination region 90 toward the active area 70 during reverse recovery operation of the semiconductor device 100, and the reverse recovery withstand capability of the semiconductor device 100 is lowered.

In contrast, by appropriately setting the doping concentration of the extension region 30, holes can be extracted through the extension region 30 during reverse recovery operation of the semiconductor device 100, and implantation of carriers into the edge termination region 90 during operation of the semiconductor device 100 can be suppressed. Thus, the withstand capability of the semiconductor device 100 can be improved.

Note that inversion of the extension region 30 as described above can be suppressed by increasing the doping concentration of the extension region 30. Thus, the value of Jrate×30/q·$v_{sat\_P}$ in the formula may be greater than 1, may be greater than 2, or may be greater than 5.

Figure 6:
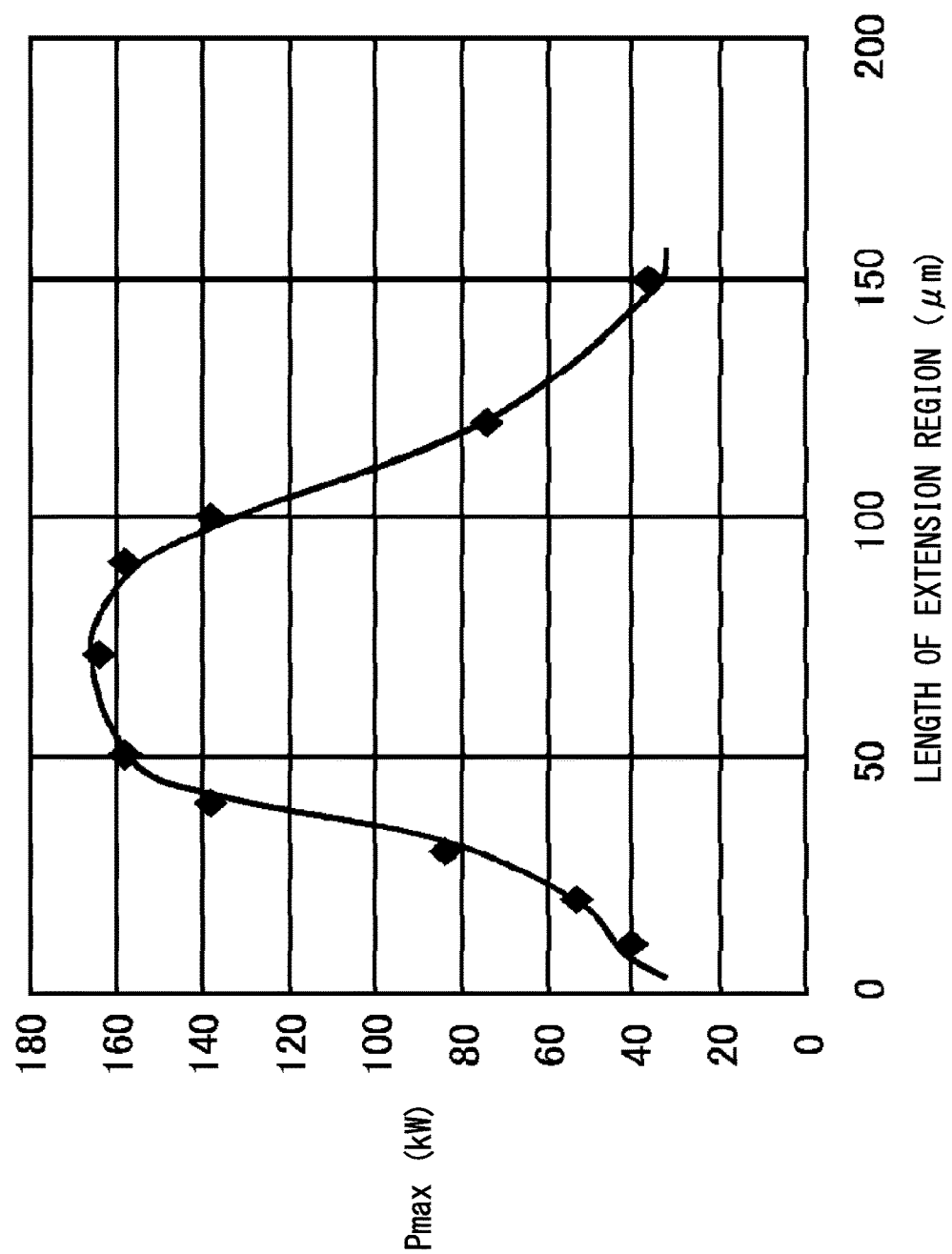
FIG. 6 shows the relationship between a length L1 (µm) of an extension region 30 and a reverse recovery withstand capability Pmax of the semiconductor device 100.

FIG. 6 shows the relationship between the length L1 (μm) of the extension region 30 and the reverse recovery withstand capability Pmax of the semiconductor device 100. In the present example, p-type impurities were implanted into the extension region 30 with a concentration of 1.3×10¹³/ cm². The example of FIG. 6 shows the characteristics under the condition that the depletion layer is not terminated at the extension section 80.

As shown in FIG. 6, the reverse recovery withstand capability Pmax is maximized at 150 (kW) or more when the length L1 of the extension region 30 is in a range of greater than 50 µm and smaller than 100 µm. If the length L1 of the extension region 30 is smaller than 50 µm, the resistance value of the extension region 30 is increased, and the effect of suppressing hole implantation into the edge termination region 90 is decreased. Thus, the reverse recovery withstand capability Pmax is lowered. Also, if the length L1 of the extension region 30 is greater than 100 µm, the resistance value of the extension region 30 is lowered, and current concentrates at the end portion 60 of the contact hole 56 during reverse recovery. Thus, the reverse recovery withstand capability Pmax is lowered.

Figure 7:
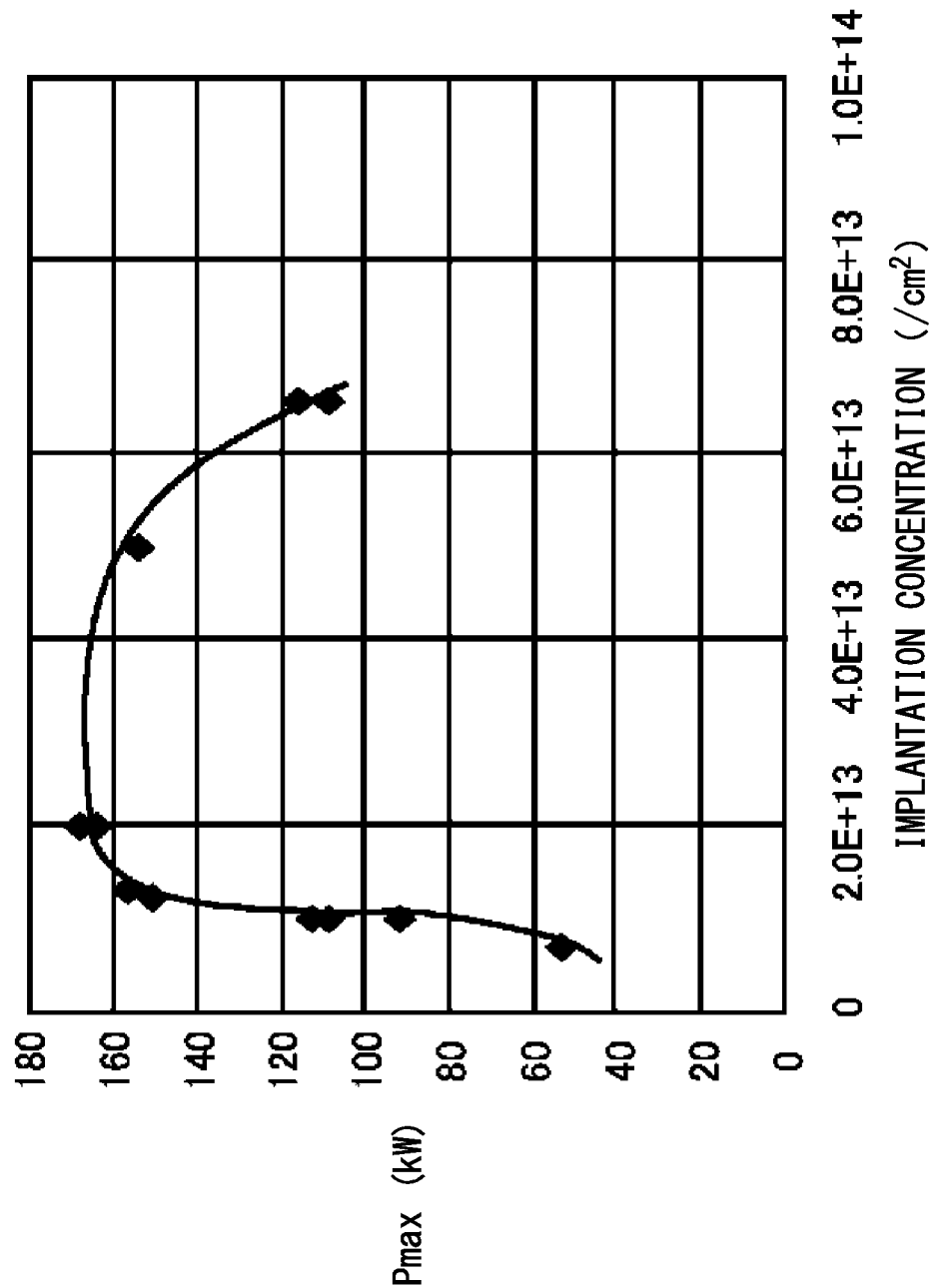
FIG. 7 shows the relationship between the concentration (/cm²) of impurities implanted into the extension region 30 and the reverse recovery withstand capability Pmax of the semiconductor device 100.

FIG. 7 shows the relationship between the concentration (/cm²) of impurities implanted into the extension region 30 and the reverse recovery withstand capability Pmax of the semiconductor device 100. In the present example, the length L1 of the extension region 30 is set to 50 µm. The example of FIG. 7 shows the characteristics under the condition that the depletion layer is not terminated at the extension section 80.

As shown in FIG. 7, the reverse recovery withstand capability Pmax is maximized at 150 (kW) or more when the implantation concentration is in a range of $1.3 \times 10^{13}$/cm² or more and $6.0 \times 10^{13}$/cm² or less. Note that the doping concentration of the extension region 30 corresponding to the above-mentioned implantation concentration is $5 \times 10^{16}$/cm³ or more and $3 \times 10^{17}$/cm³ or less.

If the concentration of impurities implanted into the extension region 30 is smaller than $1.3 \times 10^{13}$/cm², the resistance value of the extension region 30 is increased, and the effect of suppressing hole implantation into the edge termination region 90 is decreased. Also, if the concentration of impurities implanted into the extension region 30 is greater than $6.0 \times 10^{13}$/cm², the resistance value of the extension region 30 is lowered, and current concentrates at the end portion 60 of the contact hole 56 during reverse recovery. Thus, the reverse recovery withstand capability Pmax is lowered.

Inversion of the extension region 30 can be suppressed by increasing the doping concentration of the extension region 30. Thus, the doping concentration of the extension region 30 may be made as high as possible unless the resistance value of the extension region 30 is excessively decreased. The doping concentration of the extension region 30 may be $7 \times 10^{16}$/cm³ or more, or may be $1 \times 10^{17}$/cm³ or more. In this case, the upper limit value of the doping concentration of the extension region 30 may be $3 \times 10^{17}$ or less.

Figure 8:
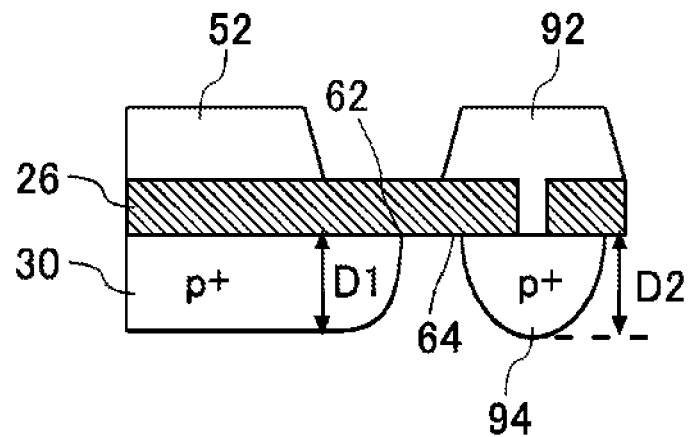
FIG. 8 is an enlarged view of the vicinity of the extension region 30 and a well region 94.

FIG. 8 is an enlarged view of the vicinity of the extension region 30 and the well region 94. The depth of the lower end of the extension region 30 and the depth of the well region 94, as measured from the upper surface of the semiconductor substrate 10, are respectively referred to as D1 and D2. The depth D1 of the lower end of the extension region 30 may be the same as the depth D2 of the well region 94. Note that the depths may be regarded to be the same if the error is within 10%.

Also, the doping concentrations of the extension region 30 and the well region 94 may be the same. Note that the doping concentrations may be regarded to be the same if the error is within 10%. The peak value of the doping concentration of each region may be regarded as its doping concentration.

By setting the depths and doping concentrations of the extension region 30 and the well region 94 to be the same, it becomes easy to form the extension region 30 and the well region 94 in the same process. Thus, the fabrication cost can be reduced. Also, masks for implanting impurities into the extension region 30 and the well region 94 can be formed in the same process. Because of this, the alignment error of the mask for the extension region 30 and the alignment error of the mask for the well region 94 are not added. Accordingly, the distance margin between the mask for the extension region 30 and the mask for the well region 94 can be made small. Thus, the distance L1+L2 can be easily made small.

Figure 9:
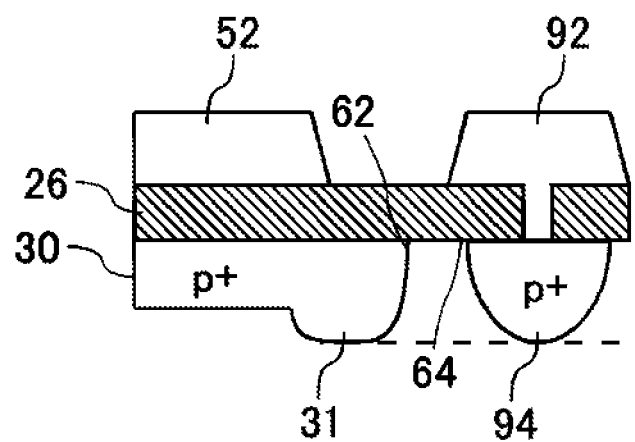
FIG. 9 is another example of an enlarged view of the vicinity of the extension region 30 and the well region 94.

FIG. 9 is another example of an enlarged view of the vicinity of the extension region 30 and the well region 94. In the present example, an end portion 31 of the extension region 30 opposing the well region 94 has the same doping concentration and depth as the well region 94. A region of the extension region 30 adjacent to the base region 14 may have the same doping concentration and depth as the base region 14.

Figure 10A:
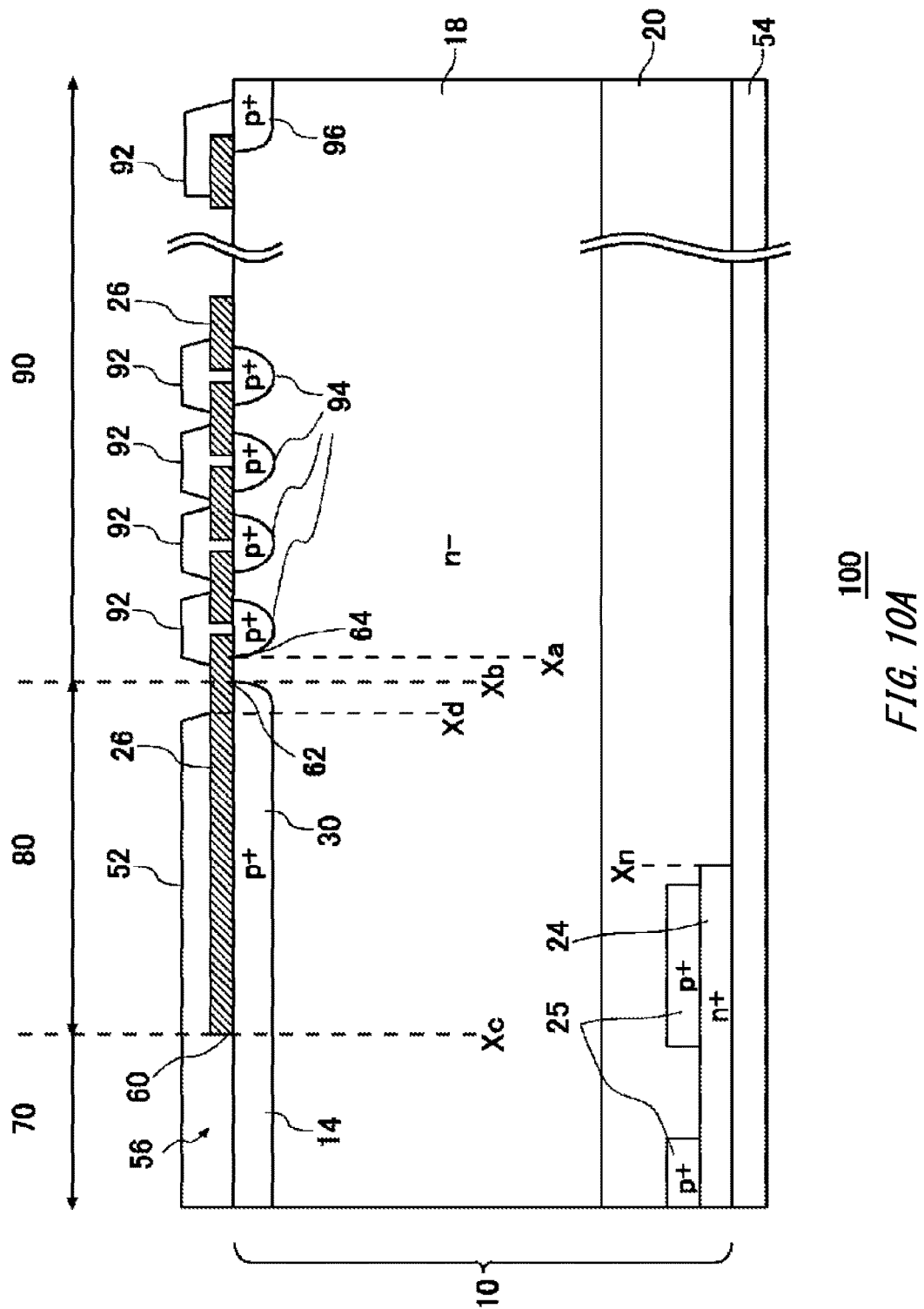
FIG. 10A is a cross-sectional view showing another example of the semiconductor device 100.

FIG. 10A is a cross-sectional view showing another example of the semiconductor device 100. The semiconductor device 100 of the present example has a different structure of the cathode region 24 from the semiconductor device 100 in any aspect described in FIG. 1 to FIG. 9. Other structures may be the same as the semiconductor device 100 in any aspect described with reference to FIG. 1 to FIG. 9.

The cathode region 24 of the present example is selectively formed on the lower-surface side of the semiconductor substrate 10. More specifically, the cathode region 24 is not formed in at least a partial region of the edge termination region 90. Note that the cathode region 24 is formed in at least a partial region of the active area 70.

In the present example, the position of an end portion of the cathode region 24 closer to the edge termination region 90 in a direction from the active area 70 toward the edge termination region 90 is referred to as Xn. If cathode regions 24 are discretely provided, the position of an end portion the cathode region 24 closest to the edge termination region 90 is referred to as Xn.

The position Xn of the end portion of the cathode region 24 closer to the edge termination region 90 may be arranged closer to the active area 70 than a position Xa of the end portion of the well region 94 closer to the active area 70. That is, the cathode region 24 may not be provided at a position overlapping with the well region 94 and in a region closer to the end portion of the semiconductor substrate 10 than the well region 94. In this manner, implantation of carriers into the edge termination region 90 during operation of the semiconductor device 100 can be suppressed. Thus, the reverse recovery withstand capability of the semiconductor device 100 can be improved.

The position Xn of the end portion of the cathode region 24 closer to the edge termination region 90 may be arranged closer to the active area 70 than a position Xb of the end portion 62 of the extension region 30 closer to the well region 94. That is, the cathode region 24 may not be formed in the edge termination region 90. In this manner, implantation of carriers into the edge termination region 90 can be further suppressed.

The position Xn of the end portion of the cathode region 24 closer to the edge termination region 90 may be arranged closer to the active area 70 than a position Xd of the end portion of the upper electrode 52 closer to the edge termination region 90. Also, it may be arranged closer to the active area 70 than a position Xc of the end portion of the contact hole 56 closer to the well region 94. That is, the cathode region 24 may not be formed in the edge termination region 90 and the extension section 80. In this manner, implantation of carriers into the edge termination region 90 can be further suppressed.

Also, a (p+)-type high-concentration region 25 which covers part of the upper surface of the cathode region 24 may be further provided inside the semiconductor substrate 10. The high-concentration region 25 is a floating region which does not contact the lower electrode 54. At least part of the high-concentration region 25 may be formed below the extension region 30, and may be formed at the end portion of the active area 70. With such a configuration, implantation of carriers into the edge termination region 90 can be further suppressed.

In the present example, it is effective particularly in the case where the concentration of the base region 14 is relatively low. Specifically, given a minimum integral of concentration $n_C$ of the base region 14 at which the depletion layer spreading from the p-n junction between the base region 14 and the drift region 18 does not punch through to the upper electrode 52 in the depth direction (direction from the upper surface toward the lower surface), the integral of concentration $n_A$ of the base region 14 may be $n_C$ or more and less than thirty times $n_C$, or further, less than ten times $n_C$.

In order for the depletion layer not to punch through to the upper electrode 52, the integral of concentration $n_A$ of the base region 14 is to be equal to or greater than the integral of concentration $n_C$. The integral of concentration $n_C$ is represented as $n_C = E_c \times (\varepsilon_0 \varepsilon_r / q)$, wherein $E_c$ is the critical electric field strength at which avalanche breakdown occurs, $\varepsilon_0$ is the dielectric constant of vacuum, $\varepsilon_r$ is the relative dielectric constant of semiconductor, and q is the elementary charge. For example, in the case of silicon, the critical electric field strength $E_c$ is $1.6 \times 10^5$ to $2.4 \times 10^5$ (V/cm) depending on the donor concentration of the drift region 18, and therefore the integral of concentration $n_C$ is approximately $1.1 \times 10^{12}$ to $1.6 \times 10^{12}$ (/cm$^2$). On the other hand, in order for the reverse recovery characteristics of the diode to be of soft recovery, it is necessary to reduce implantation of minority carriers (holes in the present example), and therefore it is desired to reduce the integral of concentration $n_A$ of the base region 14 to be as small as possible. In order for that, the integral of concentration $n_A$ of the base region 14 may be $n_C$ or more ($1.6 \times 10^{12}$ (/cm$^2$) or more) and less than thirty times $n_C$ (less than $4.8 \times 10^{13}$ (/cm$^2$)), or further, less than ten times $n_C$ (less than $1.6 \times 10^{13}$ (/cm$^2$)), as described above. In view of the above, the peak concentration of the base region 14 may be $1.0 \times 10^{16}$ (/cm$^3$) or more and $5.4 \times 10^{17}$ (/cm$^3$) or less, depending on the junction depth. Otherwise, it may be in a range as previously described above. If the base region 14 has such a low concentration, the extension region 30 which is formed with the same concentration and depth as the base region 14 has a further significantly improved reverse recovery withstand capability by virtue of the configuration in the present example.

If the base region 14 has such as low concentration, the base region 14 may be formed to have substantially the same junction depth in a region where the upper electrode 52 and the front surface of the semiconductor substrate 10 are in contact, in order to prevent punch-through of the depletion layer to the anode electrode. The word "substantially" means, for example, that the junction depth may have a distribution of within 10% in view of the fact that roughness is present in the front surface of the semiconductor substrate 10 in a region where the active area 70 is formed. Also, for example, if a plurality of trenches are formed in a region where the upper electrode 52 and the front surface of the semiconductor substrate 10 are in contact, the junction depth of the base region 14 may have a distribution of within 10% inside mesa regions sandwiched by the trenches. Furthermore, the junction depth of the base region 14 may have a distribution of within 10% among a plurality of mesa regions. In other words, the base region 14 may be formed with a substantially uniform junction depth in a region where the upper electrode 52 and the front surface of the semiconductor substrate 10 are in contact. In this manner, punch-through of the upper electrode 52 to the depletion layer to increase leakage current can be suppressed.

Figure 10B:
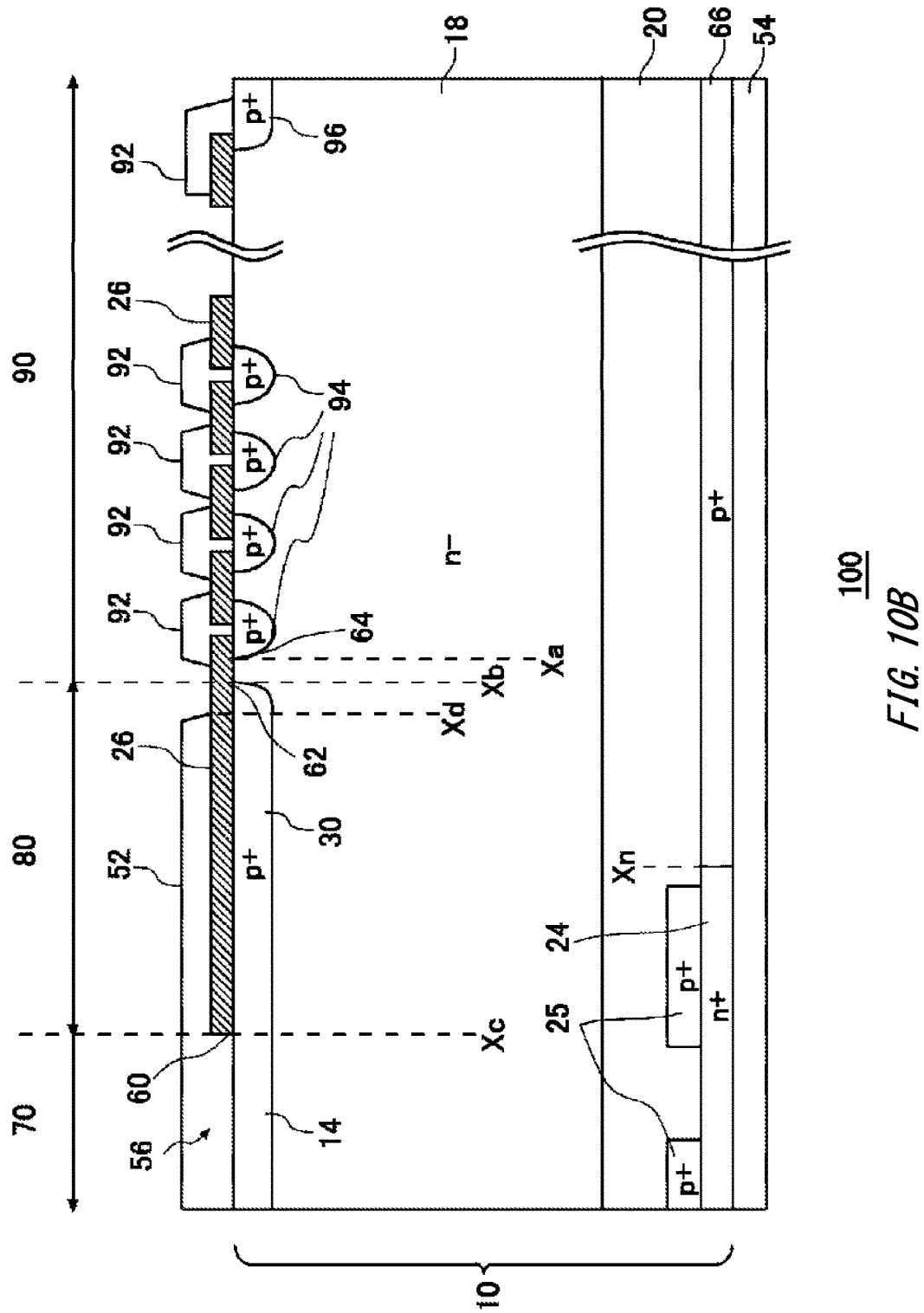
FIG. 10B is a cross-sectional view showing another example of the semiconductor device 100.

FIG. 10B is a cross-sectional view showing another example of the semiconductor device 100. The semiconductor device 100 of the present example further includes a high-concentration region 66 in addition to the structure of semiconductor device 100 described with reference to FIG. 10A. While FIG. 10A shows the semiconductor device 100 in which the buffer region 20 is in contact with the lower electrode 54, FIG. 10B shows the semiconductor device 100 in which the high-concentration region 66 is provided between the buffer region 20 and the lower electrode 54.

The high-concentration region 66 of the present example is of (p+)-type. The doping concentration of the high-concentration region 66 may be the same as the doping concentration of the high-concentration region 25. The high-concentration region 66 may be provided at the same depth position as the cathode region 24. By providing the high-concentration region 66, implantation of carriers into the edge termination region 90 can be further suppressed.

Figure 11:
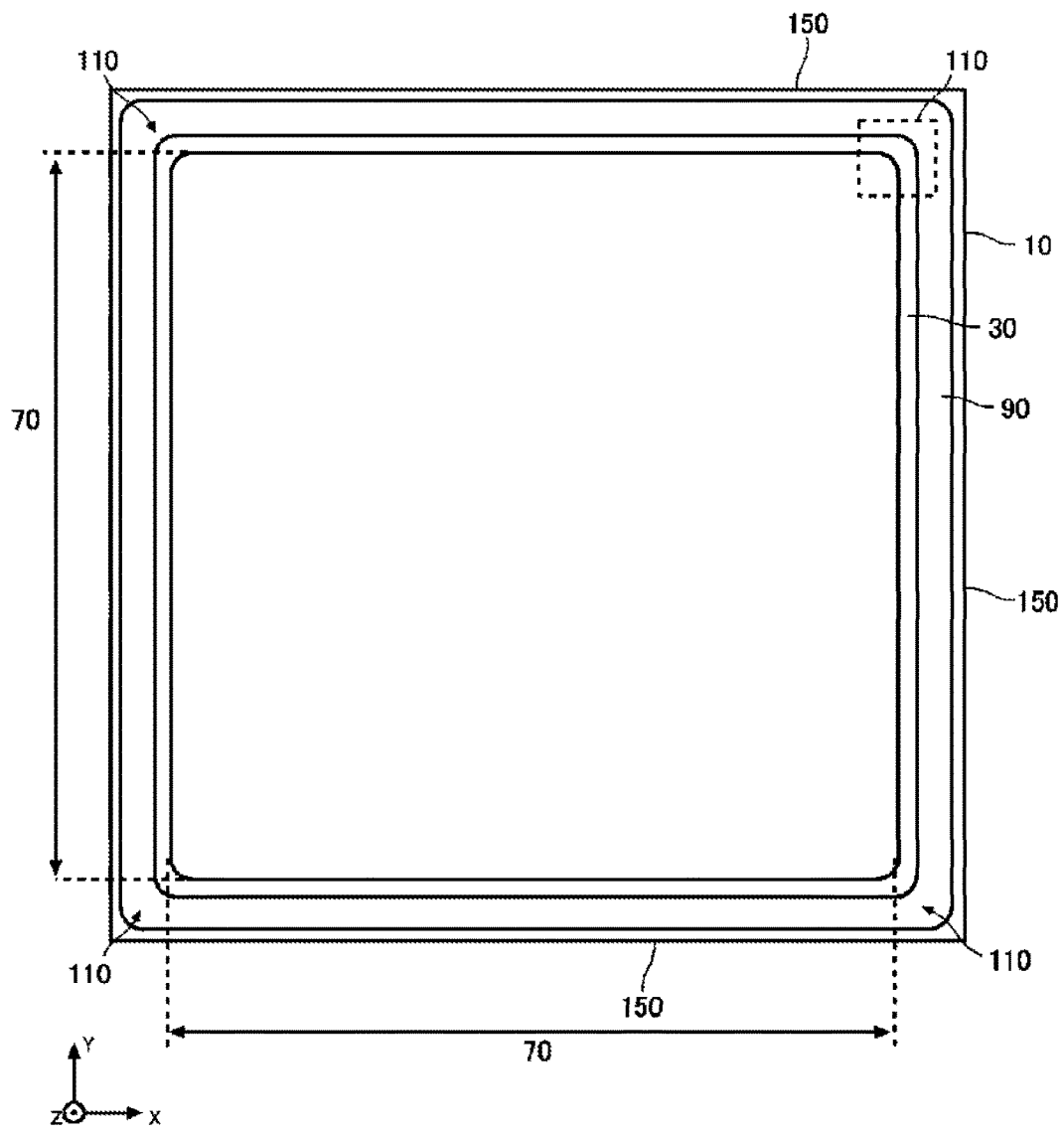
FIG. 11 shows an overview of the structure of the upper surface of the semiconductor device 100.

FIG. 11 shows an overview of the structure of the upper surface of the semiconductor device 100. The semiconductor device 100 includes a semiconductor substrate 10. Note that, pads provided on the upper surface of the semiconductor substrate 10 are omitted in FIG. 11. In this specification, the end portion of the outer perimeter of the semiconductor substrate 10 in top view is referred to as an outer perimeter end 150. The top view refers to the view as seen in parallel with the Z-axis from the upper-surface side of the semiconductor substrate 10.

The semiconductor device 100 includes an active area 70 and an edge termination region 90. As described above, a diode is provided in the active area 70. A transistor may further be provided in the active area 70. The active area 70 can be regarded as a region where the upper electrode 52 is provided in top view of the semiconductor substrate 10, and a region sandwiched by regions where the upper electrode 52 is provided.

The edge termination region 90 is provided between the active area 70 and the outer perimeter end 150 of the semiconductor substrate 10 on the upper surface of the semiconductor substrate 10. An extension region 30 is provided between the edge termination region 90 and the active area 70. The edge termination region 90 and the extension region 30 may be arranged in an annular manner to surround the active area 70 on the upper surface of the semiconductor substrate 10. The edge termination region 90 of the present example is arranged along the outer perimeter end 150 of the semiconductor substrate 10. The edge termination region 90 and the extension region 30 are formed in a curved line at corner portions 110 of the semiconductor substrate 10 in top view.

Figure 12:
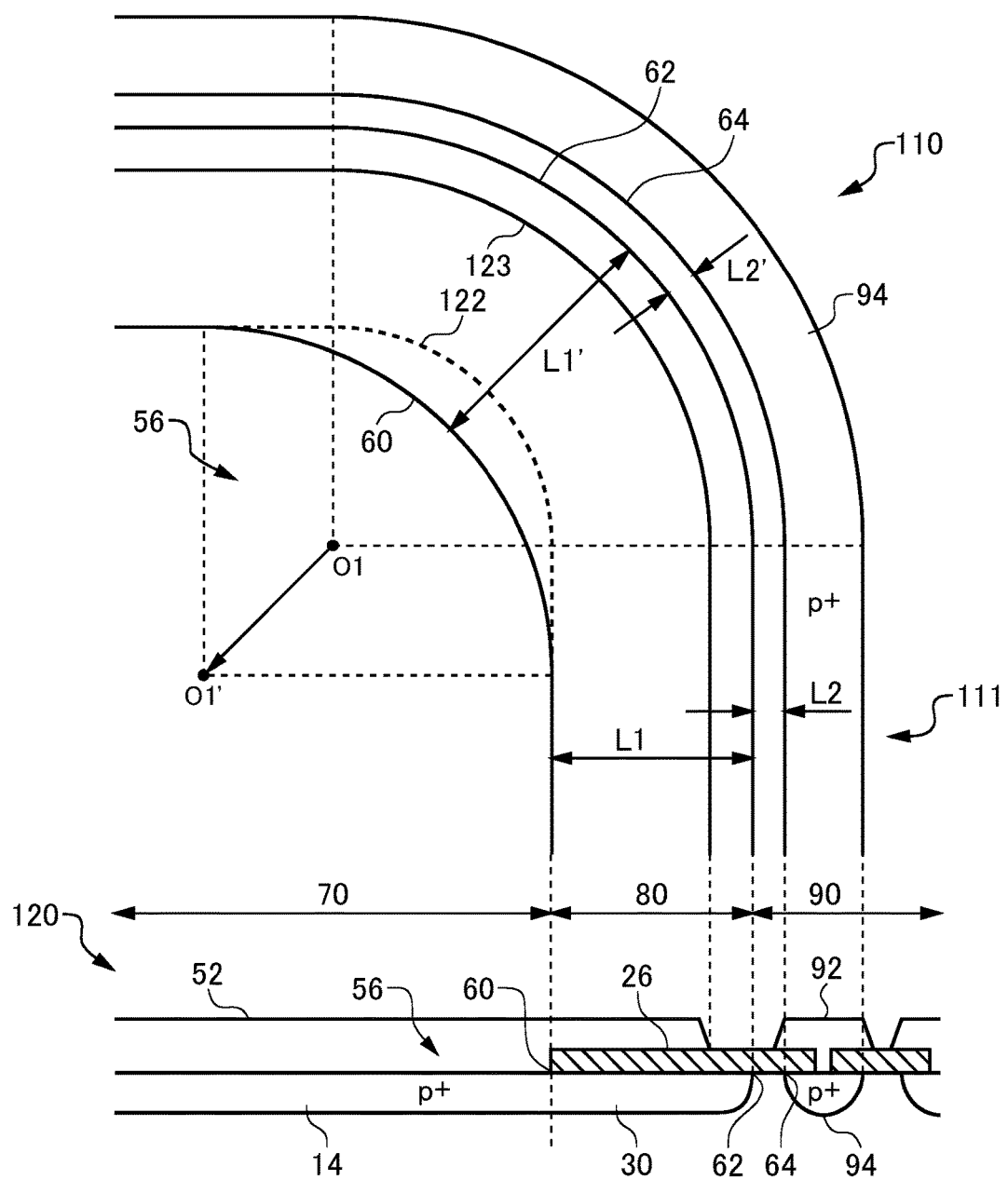
FIG. 12 shows the upper surface of a corner portion 110.

FIG. 12 shows the upper surface of a corner portion 110. In FIG. 12, a cross section 120 of the structure which corresponds to the corner portion 110 and is provided on the upper-surface side of the semiconductor substrate 10 is shown together. In the present example, at the corner portion 110, the radius of curvature of an end portion 60 of the contact hole 56 in top view is greater than the radius of curvature of an end portion 62 of the extension region 30 in top view. The end portion 60 and the end portion 62 are end portions closer to the outer perimeter end 150 of the semiconductor substrate 10 from among the end portions of the contact hole 56 and the extension region 30.

Carriers stored in the drift region 18 and the like flow toward the active area 70 during reverse recovery of the diode. Carriers in the vicinity of the corner portion 110 concentratedly flow into the contact hole 56 at the corner portion 110, so that the reverse recovery withstand capability of the corner portion 110 is lowered. In contrast, by increasing the radius of curvature of the contact hole 56, the length of the contact hole 56 at the corner portion 110 in top view can be increased. Thus, the current density of the end portion of the contact hole 56 per unit length can be reduced, so that the reverse recovery withstand capability can be improved.

In FIG. 12, an end portion 122 of the contact hole 56 in the case where it has the same radius of curvature as the end portion 62 of the extension region 30 is indicated by dashed line. The length of the curved region of the end portion of the contact hole 56 can be increased by further increasing its radius of curvature as of the end portion 60. Current is likely to concentrate at the curved region of the end portion of the contact hole 56, and therefore the current concentration can be mitigated by making the curved portion longer.

An arc center O1' of the end portion 60 of the contact hole 56 is arranged to be off toward the inside of the semiconductor substrate 10 relative to an arc center O1 of the imaginary end portion 122. A region where the edge termination region 90 is formed in a straight line in top view is referred to as a linear portion 111. A length L1' of the extension region 30 in the corner portion 110 may be greater than a length L1 of the extension region 30 in the linear portion 111. The length L1' of the extension region 30 in the corner portion 110 may adopt the maximum length of the extension region 30 in the corner portion 110. The length of the extension region 30 is a length in a direction orthogonal to the end portion 60 in top view. The length L1' may be 1.1 times or more, 1.2 times or more, or 1.5 times or more the length L1.

Also, the distance between the extension region 30 and the well region 94 in the corner portion 110 is referred to as L2'. The distance L2' may adopt the maximum distance between the extension region 30 and the well region 94 in the corner portion 110. The distance is a distance in a direction orthogonal to the end portion 62 in top view. The sum of the length L1' and the distance L2' in the corner portion 110 may be greater than the sum of the length L1 and the distance L2 in the linear portion 111.

At the corner portion 110, the radius of curvature of the end portion 60 of the contact hole 56 may be greater than the radius of curvature of an end portion 123 of the upper electrode 52. The end portion 123 of the upper electrode 52 is an end portion closer to the outer perimeter end 150 of the semiconductor substrate 10. At the corner portion 110, the radius of curvature of the end portion 60 of the contact hole 56 may be greater than the radius of curvature of the end portion 64 of the well region 94. The end portion 64 of the well region 94 is the end portion of the well region 94 that is closest to the active area 70, end portion which is closer to the active area 70.

The positive space charge density of the extension region 30 may be smaller in the corner portion 110 than in the linear portion 111. By increasing the radius of curvature of the contact hole 56 at the corner portion 110, the acceptor concentration of the corner portion 110 can be saved, so that exposure of the depletion layer 102 on the upper surface of the substrate is suppressed so as to suppress lowering of the withstand capability of the semiconductor device 100 even if part of the extension region 30 temporarily becomes unable to function as a (p+)-type region.

Figure 13:
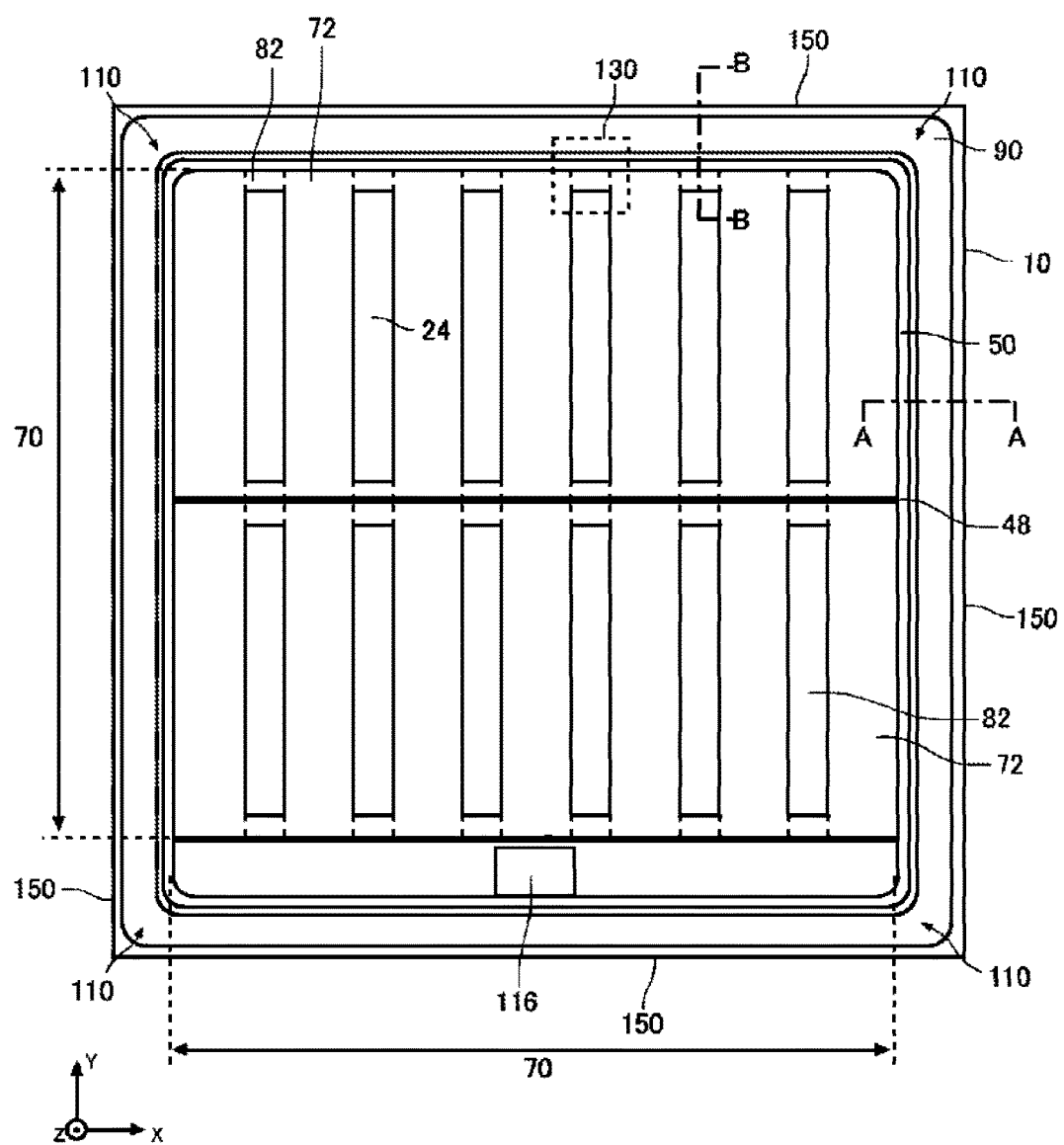
FIG. 13 shows an overview of the structure of the upper surface of a semiconductor device 200 according to another example embodiment.

FIG. 13 shows an overview of the structure of the upper surface of a semiconductor device 200 according to another example embodiment. The semiconductor device 200 is different from the semiconductor device 100 in that it includes a transistor region 72 and a diode region 82 in the active area 70. Also, the semiconductor device 200 includes a gate pad 116, a gate runner 48 and a gate metal layer 50. Other structures may be the same as the semiconductor device 100.

The transistor region 72 includes a transistor such as an IGBT. The diode region 82 is arranged alternately with the transistor region 72 in a predetermined X-axis direction on the upper surface of the semiconductor substrate 10. In this specification, the X-axis direction may be referred to as an array direction.

In each diode region 82, an (n+)-type cathode region 24 is provided in a region contacting the lower surface of the semiconductor substrate 10. In the semiconductor device 200 of the present example, a region which is in contact with the lower surface of the semiconductor substrate 10 and is not in the cathode region is a (p+)-type collector region.

The diode region 82 is a region where the cathode region 24 is projected in the Z-axis direction. The transistor region 72 is a region where the collector region is formed on the lower surface of the semiconductor substrate 10 and a unit structure including an (n+)-type emitter region is periodically formed on the upper surface of the semiconductor substrate 10. The boundary between the diode region 82 and the transistor region 72 in the X-axis direction is the boundary between the cathode region 24 and the collector region. In this specification, the diode region 82 also includes a region which is extended from the region where the cathode region 24 is projected in the Z-axis direction and reaches the end portion of the active area 70 in the Y-axis direction (indicated by the dashed line extended from the solid line of the cathode region 24 in the Y-axis direction in FIG. 13).

The transistor region 72 may be provided at both ends of the active area 70 in the X-axis direction. The active area 70 may be divided in the Y-axis direction by the gate runner 48. The transistor region 72 and the diode region 82 are arranged alternately in the X-axis direction in each divided region of the active area 70.

The gate metal layer 50 is provided between the edge termination region 90 and the active area 70 on the upper surface of the semiconductor substrate 10. Although an interlayer insulating film is provided between the gate metal layer 50 and the semiconductor substrate 10, it is omitted in FIG. 13.

The gate metal layer 50 may be provided to surround the active area 70 in top view of the semiconductor substrate 10. The gate metal layer 50 is electrically connected to the gate pad 116 provided outside the active area 70. The gate pad 116 may be arranged between the gate metal layer 50 and the active area 70. A pad electrically connected to the upper electrode 52 may be provided between the gate metal layer 50 and the active area 70.

The gate metal layer 50 may be formed of aluminum or an aluminum-silicon alloy. The gate metal layer 50 is electrically connected to the transistor region 72, and supplies a gate voltage to the transistor region 72.

The gate runner 48 is electrically connected to the gate metal layer 50, and extends to above the active area 70. At least one gate runner 48 may be provided to traverse the active area 70 in the X-axis direction. The gate runner 48 supplies a gate voltage to the transistor region 72. The gate runner 48 may be formed of a semiconductor material such as polysilicon doped with impurities, or may be formed of metal. The gate runner 48 is formed above or inside the semiconductor substrate 10, and the semiconductor substrate 10 and the gate runner 48 are insulated from each other by an insulating film.

Figure 14:
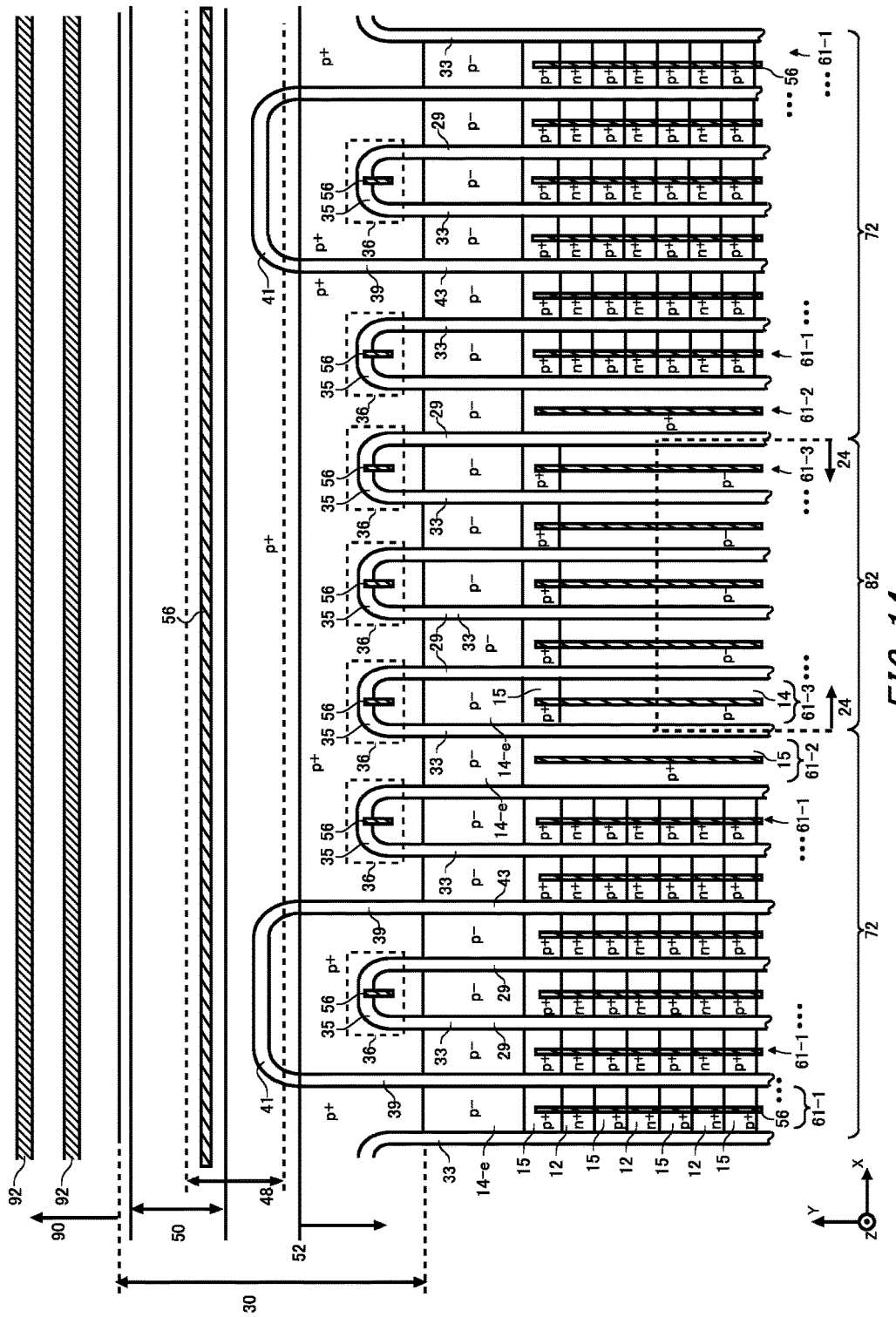
FIG. 14 is an enlarged view of the vicinity of a region 130 in FIG. 13.

FIG. 14 is an enlarged view of the vicinity of a region 130 in FIG. 13. The semiconductor device 200 of the present example includes a gate trench portion 43, a dummy trench portion 33, an extension region 30, an (n+)-type emitter region 12, a (p−)-type base region 14 and a (p+)-type contact region 15, which are provided inside the semiconductor substrate 10 and are exposed on the upper surface of the semiconductor substrate 10. In this specification, the gate trench portion 43 or the dummy trench portion 33 may be simply referred to as a trench portion. Also, the semiconductor device 200 of the present example includes an upper electrode 52, a gate metal layer 50 and a metal film 92, which are provided above the upper surface of the semiconductor substrate 10. The metal film 92, the upper electrode 52 and the gate metal layer 50 are provided being separated from each other.

The edge termination region 90 is arranged outside (in the positive Y-axis direction) the gate metal layer 50. The edge termination region 90 may include one or more metal films 92 as described above. Also, although the well region 94 is provided inside the semiconductor substrate 10 below the metal film 92, it is omitted in FIG. 14. The metal film 92 and the well region 94 are provided in an annular manner to surround the active area 70 outside the gate metal layer 50.

Although an insulating film 26 is formed between the upper surface of the semiconductor substrate 10 and each of the metal film 92, the upper electrode 52 and the gate metal layer 50, it is omitted in FIG. 14. In the insulating film 26 of the present example, a contact hole 56 is formed to penetrate the insulating film 26.

The upper electrode 52 contacts the emitter region 12, the contact region 15 and the base region 14 on the upper surface of the semiconductor substrate 10 through the contact hole 56. Also, the upper electrode 52 is connected to a dummy conductive portion in the dummy trench portion 33 through the contact hole 56. A connection portion 36 formed of a conductive material such as polysilicon doped with impurities may be provided between the upper electrode 52 and the dummy conductive portion. An insulating film such as an oxide film is formed between the connection portion 36 and the upper surface of the semiconductor substrate 10.

The gate metal layer 50 contacts the gate runner 48 through the contact hole 56. At the end portion of the active area 70, the gate metal layer 50 and the gate trench portion 43 may be connected without intervention of the gate runner 48.

The gate runner 48 is formed of polysilicon doped with impurities or the like. The gate runner 48 is connected to a gate conductive portion in the gate trench portion 43 at the upper surface of the semiconductor substrate 10. The gate runner 48 is not connected to the dummy conductive portion in the dummy trench portion 33. The gate runner 48 of the present example is formed from below the contact hole 56 to an edge portion 41 of the gate trench portion 43.

An insulating film such as an oxide film is formed between the gate runner 48 and the upper surface of the semiconductor substrate 10. At the edge portion 41 of the gate trench portion 43, the gate conductive portion is exposed on the upper surface of the semiconductor substrate 10. A contact hole to connect the gate conductive portion and the gate runner 48 is provided in the insulating film above the gate conductive portion. Note that, although the upper electrode 52 and the gate runner 48 do not overlap with each other in plan view in FIG. 14, the upper electrode 52 and the gate runner 48 may overlap with each other. In this case, an insulating film is provided between the upper electrode 52 and the gate runner 48.

The upper electrode 52 and the gate metal layer 50 are formed of a metal-containing material. For example, at least a partial region of each electrode is formed of aluminum or an aluminum-silicon alloy. Each electrode may include a barrier metal formed of titanium, a titanium compound or the like as an underlayer of a region formed of aluminum or the like, and may include a plug formed of tungsten or the like in the contact hole.

One or more gate trench portions 43 and one or more dummy trench portions 33 are arrayed at predetermined intervals along a predetermined array direction (the X-axis direction in the present example) on the upper surface of the semiconductor substrate 10. In the transistor region 72 of the present example, one or more gate trench portions 43 and one or more dummy trench portions 33 are formed alternately along the array direction.

A gate trench portion 43 of the present example may have two linear portions 39 extending in a straight line along the longitudinal direction perpendicular to the array direction (the Y-axis direction in the present example) and an edge portion 41 to connect the two linear portions 39. At least part of the edge portion 41 is preferably formed in a curved line on the upper surface of the semiconductor substrate 10. The edge portion 41 connects the end portions of the two linear portions 39 of the gate trench portion 43 to each other, the end portions being ends of their linear shapes along the longitudinal direction. Thereby, electric field concentration at the end portions of the linear portions 39 can be relaxed. In this specification, each linear portion 39 of the gate trench portion 43 may be regarded as one gate trench portion 43.

At least one dummy trench portion 33 is provided between linear portions 39 of the gate trench portion 43. Each dummy trench portion 33 may have linear portions 29 and an edge portion 35 in a manner similar to the gate trench portion 43. In another example, the dummy trench portion 33 may have a linear portion 29 and no edge portion 35. In the example shown in FIG. 14, two linear portions 29 of the dummy trench portion 33 are arranged between two linear portions 39 of the gate trench portion 43 in the transistor region 72.

In the diode region 82, a plurality of dummy trench portions 33 are arranged along the X-axis direction on the upper surface of the semiconductor substrate 10. The shape of a dummy trench portion 33 in the X-Y plane in the diode region 82 may be similar to a dummy trench portion 33 provided in the transistor region 72.

The edge portion 35 and the linear portions 29 of a dummy trench portion 33 have shapes similar to the edge portion 41 and the linear portions 39 of a gate trench portion 43. A dummy trench portion 33 provided in the diode region 82 and a linear-shaped dummy trench portion 33 provided in the transistor region 72 may have the same length in the Y-axis direction.

The upper electrode 52 is formed above the gate trench portion 43, the dummy trench portion 33, the extension region 30, the emitter region 12, the base region 14 and the contact region 15. The extension region 30 and one of the longitudinal-direction ends of the contact hole 56, one which is closer to the position where the gate metal layer 50 is provided, are provided being distanced from each other in the X-Y plane. The diffusion depth of the extension region 30 may be greater than the depths of the gate trench portion 43 and the dummy trench portion 33. Partial regions of the gate trench portion 43 and the dummy trench portion 33 closer to the gate metal layer 50 are formed in the extension region 30. The bottom portion of the edge portion 41 of the gate trench portion 43 in the Z-axis direction and the bottom portion of the edge portion 35 of the dummy trench portion 33 in the Z-axis direction may be covered by the extension region 30.

One or more mesa portions 61 sandwiched by trench portions are provided in each of the transistor region 72 and the diode region 82. A mesa portion 61 refers to a region of the semiconductor substrate 10 that is sandwiched by trench portions and is closer to the upper surface than the deepest bottom portion of the trench portions.

A base region 14 is formed in a mesa portion 61 sandwiched by trench portions. The base region 14 is a second conductivity-type ((p−)-type) region having a lower doping concentration than the extension region 30.

A second conductivity-type contact region 15 having a higher doping concentration than the base region 14 is formed on the upper surface of the base region 14 in the mesa portion 61. The contact region 15 of the present example is of (p+)-type. On the upper surface of the semiconductor substrate 10, the extension region 30 may be formed being distanced, in a direction toward the gate metal layer 50, from one of contact regions 15 that is arranged at the outermost end in the Y-axis direction. The base region 14 is exposed on the upper surface of the semiconductor substrate 10 between the extension region 30 and the contact region 15.

In the transistor region 72, a first conductivity-type emitter region 12 having a higher doping concentration than the drift region formed inside the semiconductor substrate 10 is selectively formed on the upper surface of a mesa portion 61-1. The emitter region 12 of the present example is of (n+)-type. In the base region 14 adjacent to the emitter region 12 in the depth direction of the semiconductor substrate 10 (negative Z-axis direction), a portion contacting the gate trench portion 43 functions as a channel portion. When an ON voltage is applied to the gate trench portion 43, a channel which is an inversion layer of electrons is formed at a portion adjacent to the gate trench portion 43 in the base region 14 provided between the emitter region 12 and the drift region in the Z-axis direction. The channel formed in the base region 14 allows carriers to flow between the emitter region 12 and the drift region.

In the present example, base regions 14-e are arranged at both end portions of each mesa portion 61 in the Y-axis direction. In the present example, on the upper surface of each mesa portion 61, a region adjacent to a base region 14-e on the center side of the mesa portion 61 is the contact region 15. Also, a region contacting a base region 14-e on the opposite side to the contact region 15 is the extension region 30.

In a mesa portion 61-1 in the transistor region 72 of the present example, the contact region 15 and the emitter region 12 are arranged alternately along the Y-axis direction in a region sandwiched by base regions 14-e at both ends in the Y-axis direction. Each of the contact region 15 and the emitter region 12 is formed from one of adjacent trench portions to the other trench portion.

In one or more mesa portions 61-2 provided at the boundary with the diode region 82 from among the mesa portions 61 in the transistor region 72, a contact region 15 having a larger area than a contact region 15 in a mesa portion 61-1 is provided. The emitter region 12 may not be provided in a mesa portion 61-2. In a mesa portion 61-2 of the present example, a contact region 15 is provided in the entire region sandwiched by base regions 14-e.

In each mesa portion 61-1 in the transistor region 72 of the present example, a contact hole 56 is formed above the regions of contact regions 15 and emitter regions 12. In a mesa portion 61-2, a contact hole 56 is formed above the contact region 15. In each mesa portion 61, the contact hole 56 is not formed in regions corresponding to the base regions 14-e and the extension region 30. The contact holes 56 of the respective mesa portions 61 in the transistor region 72 may have the same length in the Y-axis direction.

In the diode region 82, an (n+)-type cathode region 24 is formed in a region in contact with the lower surface of the semiconductor substrate 10. In FIG. 14, a region where the cathode region 24 is formed is indicated by dashed line. A (p+)-type collector region may be formed in a region where the cathode region 24 is not formed in a region in contact with the lower surface of the semiconductor substrate 10.

The transistor region 72 may be a region where mesa portions 61 having formed therein the contact region 15 and the emitter region 12 and trench portions adjacent to the mesa portions 61 are provided in a region overlapping with the collector region in the Z-axis direction. However, in a mesa portion 61-2 at the boundary with the diode region 82, a contact region 15 may be provided instead of the emitter region 12.

A base region 14 is arranged on the upper surface of a mesa portion 61-3 in the diode region 82. However, a contact region 15 may be provided in a region adjacent to a base region 14-e. The contact hole 56 is terminated above the contact region 15. Note that, while the diode region 82 includes five mesa portions 61-3 and seven dummy trench portions 33 sandwiching the mesa portions 61-3 in the example of FIG. 14, the number of mesa portions 61-3 and the number of dummy trench portions 33 in the diode region 82 are not so limited. A greater number of mesa portions 61-3 and dummy trench portions 33 may be provided in the diode region 82.

Figure 15:
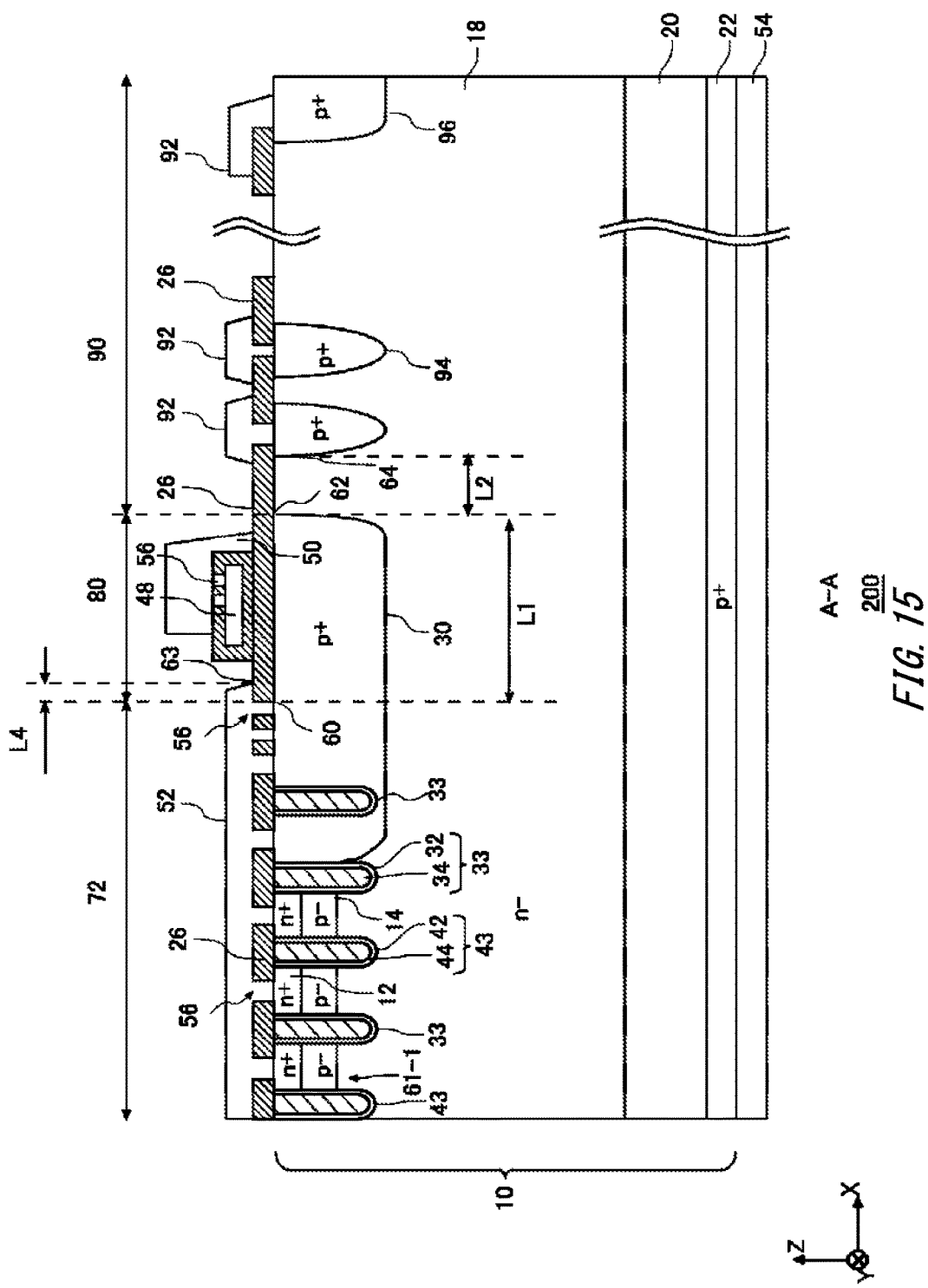
FIG. 15 shows an example of a cross section taken along A-A in FIG. 13.

FIG. 15 shows an example of a cross section taken along A-A in FIG. 13. The cross section taken along A-A is an X-Z cross section including a transistor region 72 and the edge termination region 90. The structure of the edge termination region 90 is the same as the structure of the edge termination region 90 in any aspect described with reference to FIG. 1 to FIG. 10B. However, in at least part of a region contacting the lower surface of the semiconductor substrate 10 in the edge termination region 90, a cathode region 24 may be provided instead of the collector region 22.

The transistor region 72 includes, in the cross section, the semiconductor substrate 10, the insulating film 26, the upper electrode 52 and the lower electrode 54. The insulating film 26 is formed to cover at least part of the upper surface of the semiconductor substrate 10. Through holes such as a contact hole 56 are formed in the insulating film 26. The contact hole 56 exposes the upper surface of the semiconductor substrate 10.

The upper electrode 52 is formed on the upper surfaces of the semiconductor substrate 10 and the insulating film 26. The upper electrode 52 is also formed inside the contact hole 56, and contacts the upper surface of the semiconductor substrate 10 exposed by the contact hole 56. The lower electrode 54 is formed on the lower surface of the semiconductor substrate 10. The lower electrode 54 may contact the entire lower surface of the semiconductor substrate 10.

In the transistor region 72, a (p−)-type base region 14 is formed in the semiconductor substrate 10 on its upper-surface side. An (n−)-type drift region 18 is arranged below the base region 14 inside the semiconductor substrate 10. Each trench portion is provided from the upper surface of the semiconductor substrate 10 to penetrate the base region 14 and reach the drift region 18.

In the cross section, in each mesa portion 61-1 of the transistor region 72, an (n+)-type emitter region 12 and a (p−)-type base region 14 are arranged in this order from the upper-surface side of the semiconductor substrate 10. Note that, in an X-Z cross section passing through a contact region 15 in the transistor region 72, a contact region 15 is provided in each mesa portion 61-1 of the transistor region 72 instead of an emitter region 12. The contact region 15 may function as a latch-up suppression layer to suppress latch-up.

In the transistor region 72, a (p+)-type collector region 22 is provided in a region adjacent to the lower surface of the semiconductor substrate 10. In the semiconductor substrate 10 of the present example, an (n+)-type buffer region 20 is provided between the drift region 18 and the collector region 22 and between the drift region 18 and the cathode region 24. The doping concentration of the buffer region 20 is higher than the doping concentration of the drift region 18. The buffer region 20 may function as a field stop layer to prevent a depletion layer, spreading from the lower-surface side of the base region 14, from reaching the (p+)-type collector region 22 and the (n+)-type cathode region 24.

One or more gate trench portions 43 and one or more dummy trench portions 33 are formed in the semiconductor substrate 10 on its upper-surface side. Each trench portion extends from the upper surface of the semiconductor substrate 10, penetrates the base region 14 and reaches the drift region 18. In a region where an emitter region 12 or a contact region 15 is provided, each trench portion also penetrates the region and reaches the drift region 18. That a trench portion penetrates a doping region does not necessarily mean that fabrication is performed in the order of forming a doping region and subsequently forming a trench portion. That a trench portion penetrates a doping region also means that trench portions are formed and subsequently a doping region is formed between the trench portions.

A gate trench portion 43 includes a gate trench, a gate insulating film 42 and a gate conductive portion 44, which are formed in the semiconductor substrate 10 on its upper-surface side. The gate insulating film 42 is formed to cover the inner wall of the gate trench. The gate insulating film 42 may be formed by oxidizing or nitriding the semiconductor material of the inner wall of the gate trench. The gate conductive portion 44 is formed inside the gate trench on an inner side relative to the gate insulating film 42. That is, the gate insulating film 42 insulates the gate conductive portion 44 and the semiconductor substrate 10 from each other. The gate conductive portion 44 is formed of a conductive material such as polysilicon.

The gate conductive portion 44 at least includes a region opposing an adjacent base region 14 with intervention of the gate insulating film 42 in the depth direction. In the cross section, the gate trench portion 43 is covered by the insulating film 26 on the upper surface of the semiconductor substrate 10. When a predetermined voltage is applied to the gate conductive portion 44, a channel as an inversion layer of electrons is formed in the interfacial surface layer of the base region 14 in contact with the gate trench.

In the cross section, a dummy trench portion 33 may have the same structure as a gate trench portion 43. A dummy trench portion 33 has a dummy trench, a dummy insulating film 32 and a dummy conductive portion 34, which are formed in the semiconductor substrate 10 on its upper-surface side. The dummy insulating film 32 is formed to cover the inner wall of the dummy trench. The dummy conductive portion 34 is formed inside the dummy trench and formed on an inner side relative to the dummy insulating film 32. The dummy insulating film 32 insulates the dummy conductive portion 34 and the semiconductor substrate 10 from each other. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction. In the cross section, the dummy trench portion 33 is covered by the insulating film 26 on the upper surface of the semiconductor substrate 10. Note that the bottom portions of the dummy trench portion 33 and the gate trench portion 43 may have a shape of a curved surface (a curved line in the cross section) that is downwardly convex.

An extension region 30 may be provided at the end portion of the transistor region 72 closer to the extension section 80. The extension region 30 is formed to a greater depth than the base region 14. The extension region 30 of the present example is formed to a greater depth than each trench portion. At least one trench portion in the transistor region 72 may be formed in the extension region 30.

A contact hole 56 to connect the extension region 30 and the upper electrode 52 is provided in the insulating film 26 in the transistor region 72. The contact hole 56 may extend in a straight line in the Y-axis direction. In the X-axis direction, the distance between the end portion 60 of the contact hole 56 provided closest to the extension section 80 and the end portion 62 of the extension region 30 is equivalent to the first distance L1.

A gate metal layer 50, an insulating film 26, a gate runner 48 and an extension region 30 are provided in the extension section 80. The gate metal layer 50 is provided above the upper surface of the semiconductor substrate 10. The insulating film 26 is provided between the gate metal layer 50 and the semiconductor substrate 10.

The gate runner 48 is provided between the gate metal layer 50 and the semiconductor substrate 10. The insulating film 26 is provided between the gate runner 48 and the gate metal layer 50 and between the gate runner 48 and the semiconductor substrate 10. The gate runner 48 and the gate metal layer 50 are connected to each other through a contact hole 56 provided in the insulating film 26. The gate metal layer 50 may be formed inside the contact hole 56.

The extension region 30 is provided below the gate metal layer 50 and the gate runner 48. In the X-axis direction, the range in which the extension region 30 is provided is preferably wider than the range in which the gate metal layer 50 and the gate runner 48 are provided.

In the present example as well, the sum of the first distance L1 and the second distance L2 may be smaller than the thickness Wt of the semiconductor substrate 10. In this manner, even if acceptors and holes in the extension region 30 are cancelled during reverse recovery operation, the depletion layer can be extended from the active area 70 to the edge termination region 90. Accordingly, the reverse recovery withstand capability can be improved. Note that the first distance L1 and the second distance L2 shown in FIG. 15 may satisfy the same condition as the first distance L1 and the second distance L2 as described with reference to FIG. 1 to FIG. 10B.

Figure 16:
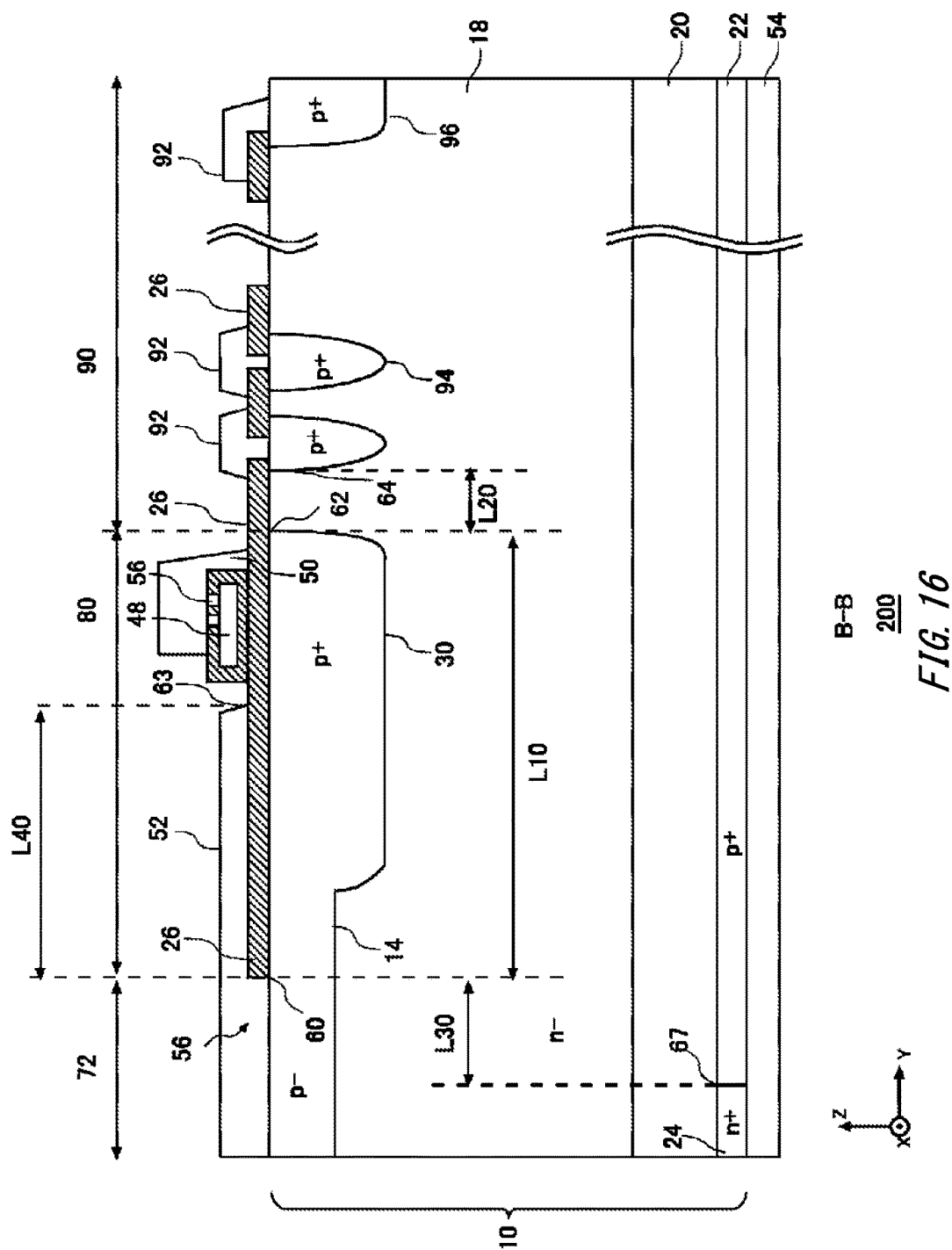
FIG. 16 shows an example of a cross section taken along B-B in FIG. 13.

FIG. 16 shows an example of a cross section taken along B-B in FIG. 13. The cross section taken along B-B is a Y-Z cross section including a diode region 82 and the edge termination region 90. The cross section passes through the contact hole 56 in the diode region 82. The structure of the edge termination region 90 is the same as the structure of the edge termination region 90 in any aspect described with reference to FIG. 1 to FIG. 10B.

The diode region 82 has a structure similar to the active area 70 as described with reference to FIG. 1 to FIG. 10B. However, in the example of FIG. 16, the base region 14 is formed to a shallower position than the extension region 30.

In the extension section 80 of the present example, a gate metal layer 50 and a gate runner 48 are provided in addition to the structure of the extension section 80 shown in FIG. 1. In the Y-axis direction, the distance between the end portion 60 of the contact hole 56 of the diode region 82 and the end portion 62 of the extension region 30 is referred to as a first distance L10. In the Y-axis direction, the distance between the end portion 62 of the extension region 30 and the end portion 64 of the well region 94 is referred to as a second distance L20. The sum of the first distance L10 and the second distance L20 may be smaller than the thickness Wt of the semiconductor substrate 10. In this manner, even if acceptors and holes in the extension region 30 are cancelled during reverse recovery operation, the depletion layer can be extended from the active area 70 to the edge termination region 90. Accordingly, the reverse recovery withstand capability can be improved. Note that the first distance L10 and the second distance L20 shown in FIG. 16 may satisfy the same condition as the first distance L1 and the second distance L2 as described with reference to FIG. 1 to FIG. 10B.

Also, in the Y-axis direction, the distance between an end portion 67 of the cathode region 24 and the end portion 60 of the contact hole 56 is referred to as L30. The distance L30 may be smaller than the distance L10. Also, the distance between an end portion 63 of the upper electrode 52 in the X-axis direction and the end portion 60 of the contact hole 56 as shown in FIG. 15 is referred to as L4, and the distance between an end portion 63 of the upper electrode 52 in the Y-axis direction and the end portion 60 of the contact hole 56 as shown in FIG. 16 is referred to as L40. The distance L40 may be greater than the distance L4. Note that, also in a Y-Z cross section passing through a contact hole 56 in the transistor region 72, distances such as the first distance L10 and the second distance L20 may satisfy the same conditions of the distances described with reference to FIG. 16.

Figure 17:
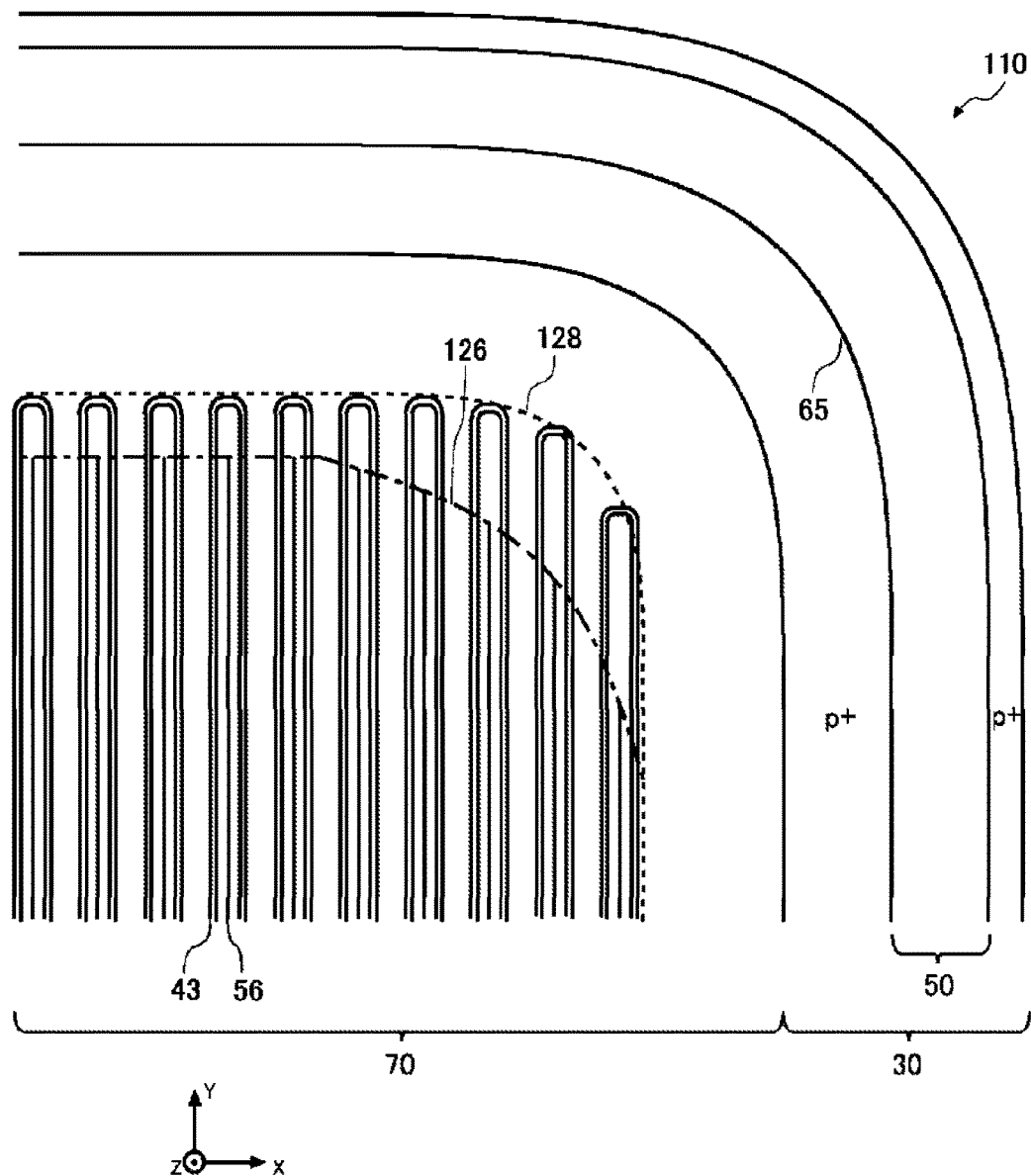
FIG. 17 shows another example of a corner portion 110.

FIG. 17 shows another example of a corner portion 110. The corner portion 110 of the present example includes a plurality of trench portions such as a dummy trench portion 33 and contact holes 56 arranged between the trench portions, in the active area 70.

In the Y-axis direction, a line connecting the tips of the respective trench portions is referred to as a curved line 128, and a line connecting the tips of the contact holes 56 is referred to as a curved line 126. The radius of curvature of the curved line 126 may be greater than the radius of curvature of the curved line 128. By increasing the radius of curvature of the curved line 126 for the contact holes 56, current concentration at the end portions of the contact holes 56 at the corner portion 110 can be mitigated. The radius of curvature of the curved line 126 may be greater than the radius of curvature of an end portion 65 of the gate metal layer 50 closer to the active area 70.

The positive space charge density of the base region 14 in a mesa portion 61 sandwiched by trench portions may be smaller in the corner portion 110 than in the linear portion 111. As above, the acceptor concentration of the base region 14 at the corner portion 110 is saved by increasing the length from the end portion of a trench to the end portion of the contact hole 56 at the corner portion 110. In this manner, even if part of the base region 14 temporarily becomes unable to function as a (p+)-type region, exposure of the depletion layer 102 on the upper surface of the substrate can be suppressed so as to suppress lowering of the withstand capability of the semiconductor device 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising a semiconductor substrate having formed therein an active area in which main current flows and an edge termination region to relax electric field, wherein the semiconductor device comprises:
an upper electrode provided above the semiconductor substrate;
an insulating film which is provided between the semiconductor substrate and the upper electrode, and has formed therein a contact hole;
a first conductivity-type drift region formed inside the semiconductor substrate;
a second conductivity-type base region which is formed on an upper-surface side of the semiconductor substrate in the active area, and is connected to the upper electrode through the contact hole;
a second conductivity-type well region which is formed on an upper-surface side of the semiconductor substrate in the edge termination region, and is separated from the upper electrode; and
a second conductivity-type extension region which is formed extending in a direction toward the well region from the base region on an upper-surface side of the semiconductor substrate, and is separated from the upper electrode by the insulating film, and wherein in a plane parallel to an upper surface of the semiconductor substrate, a sum of a first distance from an end portion of the contact hole closer to the well region to an end portion of the extension region closer to the well region and a second distance from the end portion of the extension region closer to the well region to the well region is smaller than a thickness of the semiconductor substrate in the active area, and at a corner portion of the semiconductor substrate, a radius of curvature of an end portion of the contact hole in top view is greater than a radius of curvature of an end portion of the extension region in top view.

2. The semiconductor device according to claim 1, the sum of the first distance and the second distance is greater than 50 μm.

3. The semiconductor device according to claim 1, wherein the sum of the first distance and the second distance is smaller than 100 µm.

4. The semiconductor device according to claim 1, wherein a doping concentration $N_A$ of the extension region satisfies the following formula:

$$0.1 < \frac{N_A}{\left(\frac{J_{rate} \times 30}{q \cdot v_{sat\_P}}\right)} < 10$$

wherein Jrate is a rated current density (A/cm$^2$), q is an elementary charge (C), and $v_{sat\_P}$ is a saturation velocity of holes (cm/sec).

5. The semiconductor device according to claim 1, wherein a doping concentration of the extension region is 5.0×10$^{16}$/cm$^3$ or more and 3.0×10$^{17}$/cm$^3$ or less.

6. The semiconductor device according to claim 1, wherein a depth of the extension region is same as a depth of the well region.

7. The semiconductor device according to claim 1, wherein a doping concentration of the extension region is same as a doping concentration of the well region.

8. The semiconductor device according to claim 1,
further comprising a first conductivity-type cathode region which is provided between the drift region and a lower surface of the semiconductor substrate inside the semiconductor substrate, and has a higher doping concentration than the drift region, wherein
an end portion of the cathode region closer to the edge termination region is arranged closer to the active area than the well region.

9. The semiconductor device according to claim 8, wherein the end portion of the cathode region closer to the edge termination region is arranged closer to the active area than the end portion of the extension region closer to the well region.

10. The semiconductor device according to claim 8, wherein the end portion of the cathode region closer to the edge termination region is arranged farther from the well region than the end portion of the contact hole closer to the well region.

* * * * *